United States Patent [19]

Usami et al.

[11] Patent Number: 5,572,561
[45] Date of Patent: Nov. 5, 1996

[54] FREQUENCY DIVIDING CIRCUIT

[75] Inventors: Kunihiro Usami, Yamanashi; Miki Kubota, Kawasaki, both of Japan

[73] Assignee: Fujitsu Limited, Kawasaki, Japan

[21] Appl. No.: 466,728

[22] Filed: Jun. 6, 1995

[30] Foreign Application Priority Data

Jun. 24, 1994 [JP] Japan ..................... 6-142706

[51] Int. Cl.⁶ ............... H03K 23/54; H03K 21/00
[52] U.S. Cl. ............... 377/47; 377/105; 377/117; 377/121; 327/115
[58] Field of Search ................. 327/115, 117; 377/105, 115, 116, 217, 121, 126, 47

[56] References Cited

U.S. PATENT DOCUMENTS

| | | | |
|---|---|---|---|
| 3,829,713 | 8/1974 | Canning | 327/115 |
| 4,020,362 | 4/1977 | Suzuki et al. | 377/126 |
| 5,131,018 | 7/1992 | McAdams et al. | 377/121 |
| 5,227,674 | 7/1993 | Takahashi et al. | 377/117 |

Primary Examiner—John S. Heyman
Attorney, Agent, or Firm—Nikaido, Marmelstein, Murray & Oram LLP

[57] ABSTRACT

A frequency dividing circuit includes a first inverter circuit supplied with a first frequency-divided signal, a second inverter circuit supplied with a second frequency-divided signal which has a complementary relationship to the first frequency-divided signal, and a first pair of push-pull circuits. There are also provided a first switch circuit performing a first switching operation in response to a first input signal and selectively supplying output signals of the first and second inverter circuits to the first pair of push-pull circuits so that one of the first pair of push-pull circuits performs a pull-up operation when the other one thereof performs a pull-down operation. Further, there are provided a second pair of push-pull circuits, and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation. The first and second frequency-divided signals are output from the second pair of push-pull circuits.

10 Claims, 26 Drawing Sheets

FREQUENCY DIVIDING CIRCUIT

BACKGROUND OF THE INVENTION

1. Field of the Invention

The present invention generally relates to frequency dividing circuits, and more particularly to a frequency dividing circuit suitably used for, for example, a frequency converting circuit built in integrated circuits devices for communications.

2. Background of the Invention

FIG. 1 is a circuit diagram of a frequency dividing circuit as described above. The frequency dividing circuit shown in FIG. 1 has an SCFL circuit 1. The term "SCFL" is an abbreviation of Source Coupled Field effect transistor Logic. The SCFL circuit 2 includes a differential amplifier circuit 2, a level-shift diode 3, load resistors 4 and 5, MESFETs 6 and 7 of the depletion type serving as driving transistors, and a MESFET 8 of the depletion type functioning as a constant-current source. The term "MESFET" is an abbreviation of MEtal Semiconductor Field Effect Transistor.

Further, the frequency dividing circuit includes source-follower circuits 9–14, MESFETs 15–20 20 of the depletion type functioning as input transistors, level-shift diodes 21–32 and MESFETs 33–38 of the depletion type functioning as constant-current sources. Furthermore, the frequency dividing circuit includes MESFETs 39 and 40 of the enhancement type, and MESFETs 41 and 42 of the enhancement type. The MESFETs 39 and 40 are turned ON and OFF by an input signal IN which is to be frequency-divided. The MESFETs 41 and 42 are turned ON and OFF by an inverted version $\overline{\text{IN}}$ of the input signal IN (the signal $\overline{\text{IN}}$ has a complementary relationship to the signal IN).

The MESFETs 39 and 40 are alternately turned ON in response to the input signal IN, and the MESFETs 41 and 42 are alternately turned ON in response to the inverted input signal $\overline{\text{IN}}$. Thereby, frequency-divided signals OUT and $\overline{\text{OUT}}$ which are complementary signals are produced so that the signals OUT and $\overline{\text{OUT}}$ have a frequency half the frequency of the signals IN and $\overline{\text{IN}}$.

However, the frequency dividing circuit shown in FIG. 1 has a disadvantage in that it needs a large number of structural elements, and a large amount of power is consumed because currents always flow in the differential amplifier circuit 2 and the source-follower circuits 9–14. Further, the frequency dividing circuit shown in FIG. 1 has another disadvantage in that the frequency dividing circuit cannot be driven by a relatively low power supply voltage VDD due to the presence of the level-shift diodes 21–32.

With the above in mind, an improved frequency dividing circuit as shown in FIG. 2 has been proposed. The frequency dividing circuit shown in FIG. 2 includes a BFL circuit 44 functioning as an inverter circuit. The term "BFL" is an abbreviation of a Buffered Field effect transistor Logic. The BFL circuit 44 includes an inverter 45, a MESFET 46 of the depletion type functioning as a load element, and a MESFET 47 of the depletion type serving as a driving element.

The frequency dividing circuit shown in FIG. 2 includes source-follower circuits 48–50, MESFETs 51–53 of the depletion type functioning as input transistors, level-shift diodes 54–59, and MESFETs 60–62 of the depletion type functioning as constant-current sources. Further, the frequency dividing circuit shown in FIG. 2 includes MESFETs 63 and 64 of the enhancement type. The MESFET 63 is turned ON and OFF in response to the input signal IN, and the MESFET 64 is turned ON and OFF in response to its inverted version $\overline{\text{IN}}$. The MESFETs 63 and 64 are alternately turned ON in response to the signals IN and $\overline{\text{IN}}$, whereby a frequency-divided output signal OUT having a frequency equal to half that of the input signals is produced.

The frequency dividing circuit shown in FIG. 2 can be configured by a smaller number of parts than that for the circuit shown in FIG. 1. However, the frequency dividing circuit shown in FIG. 2 has a disadvantage in that it needs two power supply sources VDD and VSS, and cannot be driven by a single power supply source. The circuit shown in FIG. 2 has another disadvantage in that currents always flow in the inverter 45 and the source-follower circuits 48–50 and the complementary output signals cannot be produced.

Taking into consideration the above, a further improved frequency dividing circuit as shown in FIG. 3 has been proposed. The circuit shown in FIG. 3 includes DCFL circuits 66–68 functioning as inverter circuits. The term "DCFL" is an abbreviation of Direct Coupled Field effect transistor Logic. Further, the circuit shown in FIG. 3 includes MESFETs 69–71 of the depletion type functioning as load elements, and MESFETs 72–74 of the enhancement type functioning as driving elements.

Furthermore, the circuit shown in FIG. 3 includes MESFETs 75 and 76 of the enhancement type. The MESFET 75 is turned ON and OFF in response to the input signal IN, and the MESFET 76 is turned ON and OFF in response to its inverted version $\overline{\text{IN}}$. The MESFETs 75 and 76 are alternately turned ON in response to the signals IN and $\overline{\text{IN}}$, so that the frequency-divided output signal OUT having a frequency equal to half that of the signals IN and $\overline{\text{IN}}$ can be produced.

The frequency dividing circuit shown in FIG. 3 has advantages in that it can be driven by a single power supply source and a relatively low power supply voltage and a smaller amount of power can be consumed therein. However, the circuit shown in FIG. 3 has a disadvantage in that the complementary output signals cannot be obtained.

SUMMARY OF THE INVENTION

It is a general object of the present invention to provide a frequency dividing circuit in which the above disadvantages are eliminated.

A more specific object of the present invention is to provide a frequency dividing circuit which can be driven by a single power supply source and a low power supply voltage and which consumes a smaller amount of power and output complementary frequency-divided output signals.

The above objects of the present invention are achieved by a frequency dividing circuit comprising:

a first inverter circuit supplied with a first frequency-divided signal;

a second inverter circuit supplied with a second frequency-divided signal which has a complementary relationship to the first frequency-divided signal;

a first pair of push-pull circuits;

a first switch circuit performing a first switching operation in response to a first input signal and selectively supplying output signals of the first and second inverter circuits to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first and second frequency-divided signals being output from the second pair of push-pull circuits. According to the above configuration, the frequency of the first and second frequency-divided signals are half that of the first and second input signals.

The above objects of the present invention are also achieved by a frequency dividing circuit comprising:

an inverter circuit supplied with a first frequency-divided signal;

a first pair of push-pull circuits;

a first switch circuit performing a first switching operation in response to a first input signal and selectively supplying an output signal of the inverter circuit and the first frequency-divided signal to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first frequency-divided signal being output from one of the second pair of push-pull circuits and a second frequency divided signal which is a complementary relationship to the first frequency-divided signal being output from the other one of the second pair of push-pull circuits. According to the above configuration, the frequency of the first and second frequency-divided signals are half that of the first and second input signals.

The above objects of the present invention are also achieved by a frequency dividing circuit comprising:

a plurality of frequency-dividing parts which are cascaded, each of the plurality of frequency-dividing parts comprising:

a first inverter circuit supplied with a first frequency-divided signal;

a second inverter circuit supplied with a second frequency-divided signal which has a complementary relationship to the first frequency-divided signal;

a first pair of push-pull circuits;

a first switch circuit performing a first switching operation in response to a first input signal and selectively supplying output signals of the first and second inverter circuits to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first and second frequency-divided signals being output from the second pair of push-pull circuits. According to the above configuration, it is possible to divide the frequency of the first and second input signals at an arbitrary frequency-dividing ratio.

The aforementioned objects of the present invention are also achieved by a frequency dividing circuit comprising:

a plurality of frequency-dividing parts which are cascaded, each of the plurality of frequency-dividing parts comprising:

an inverter circuit supplied with a first frequency-divided signal;

a first pair of push-pull circuits;

a first switch circuit performing a first switching operation in response to a first input signal and selectively supplying an output signal of the inverter circuit and the first frequency-divided signal to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first frequency-divided signal being output from one of the second pair of push-pull circuits and a second frequency divided signal which is a complementary relationship to the first frequency-divided signal being output from the other one of the second pair of push-pull circuits. According to the above configuration, it is possible to divide the frequency of the first and second input signals at an arbitrary frequency-dividing ratio.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
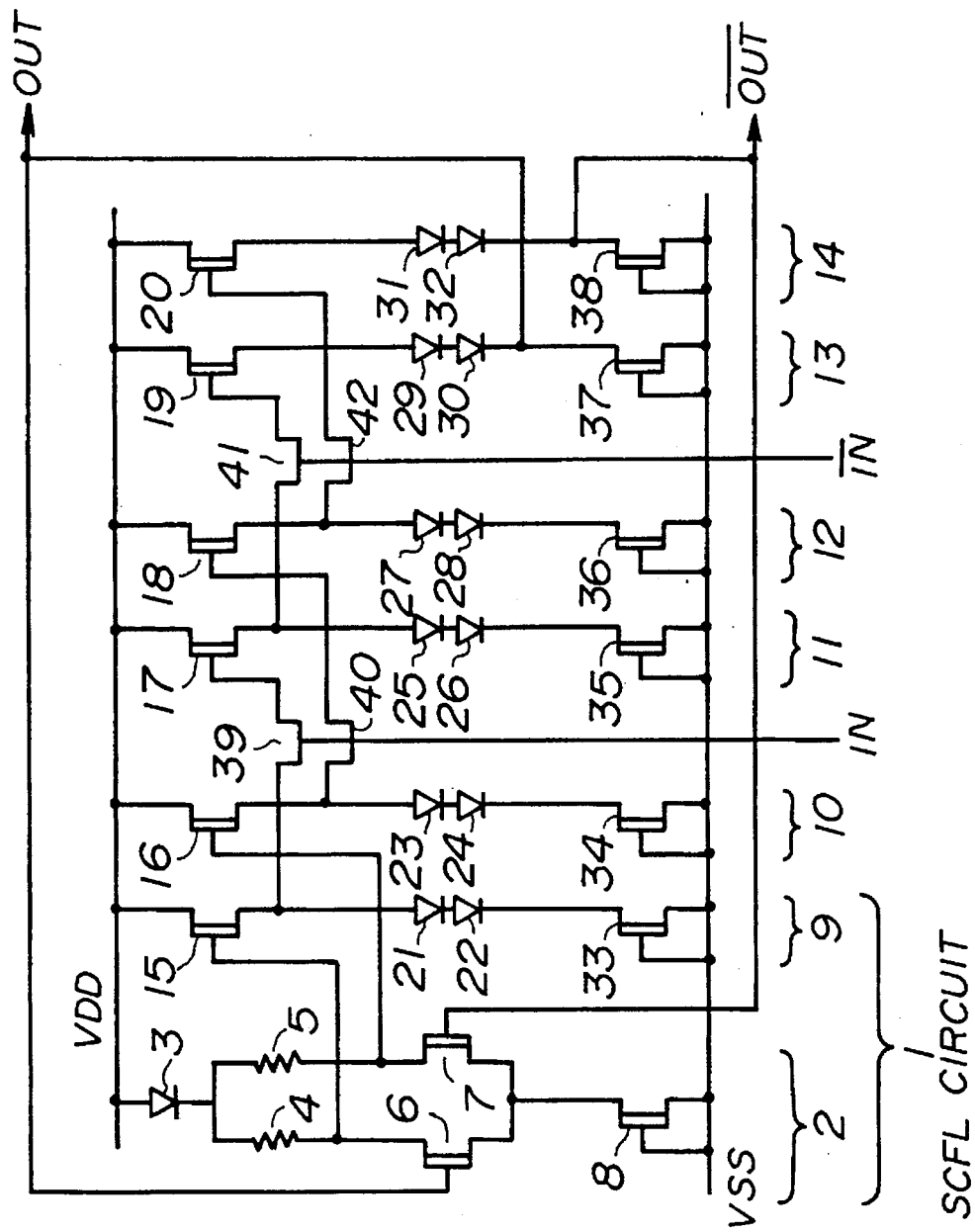
FIG. 1 is a circuit diagram of a conventional frequency dividing circuit.
Figure 2:
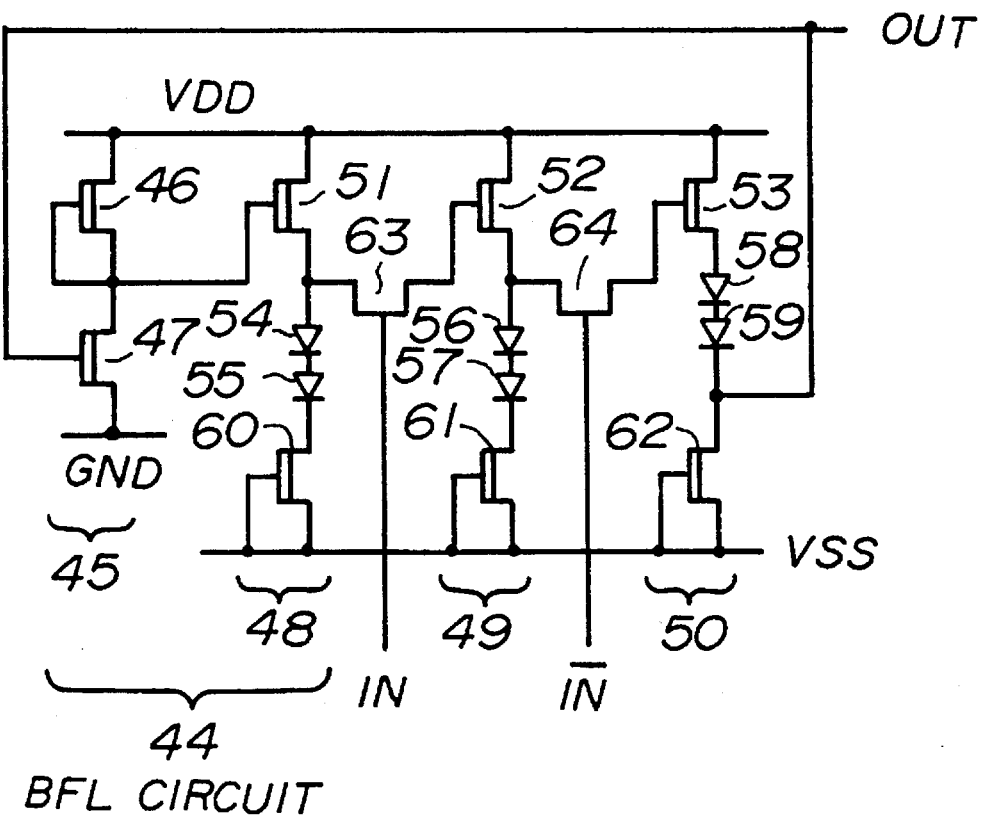
FIG. 2 is a circuit diagram of another conventional frequency dividing circuit.
Figure 3:
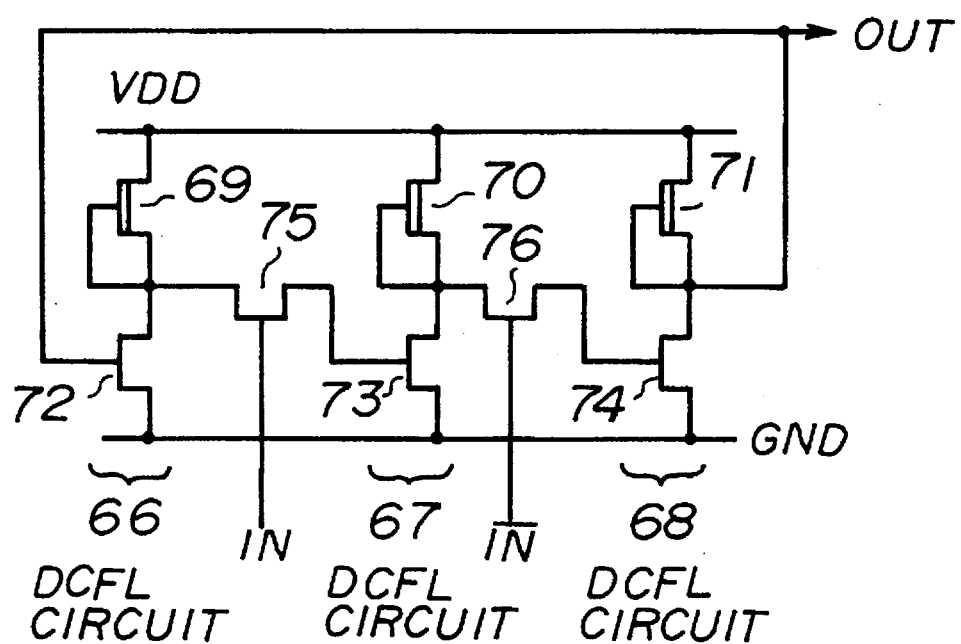
FIG. 3 is a circuit diagram of yet another conventional frequency dividing circuit.
Figure 4:
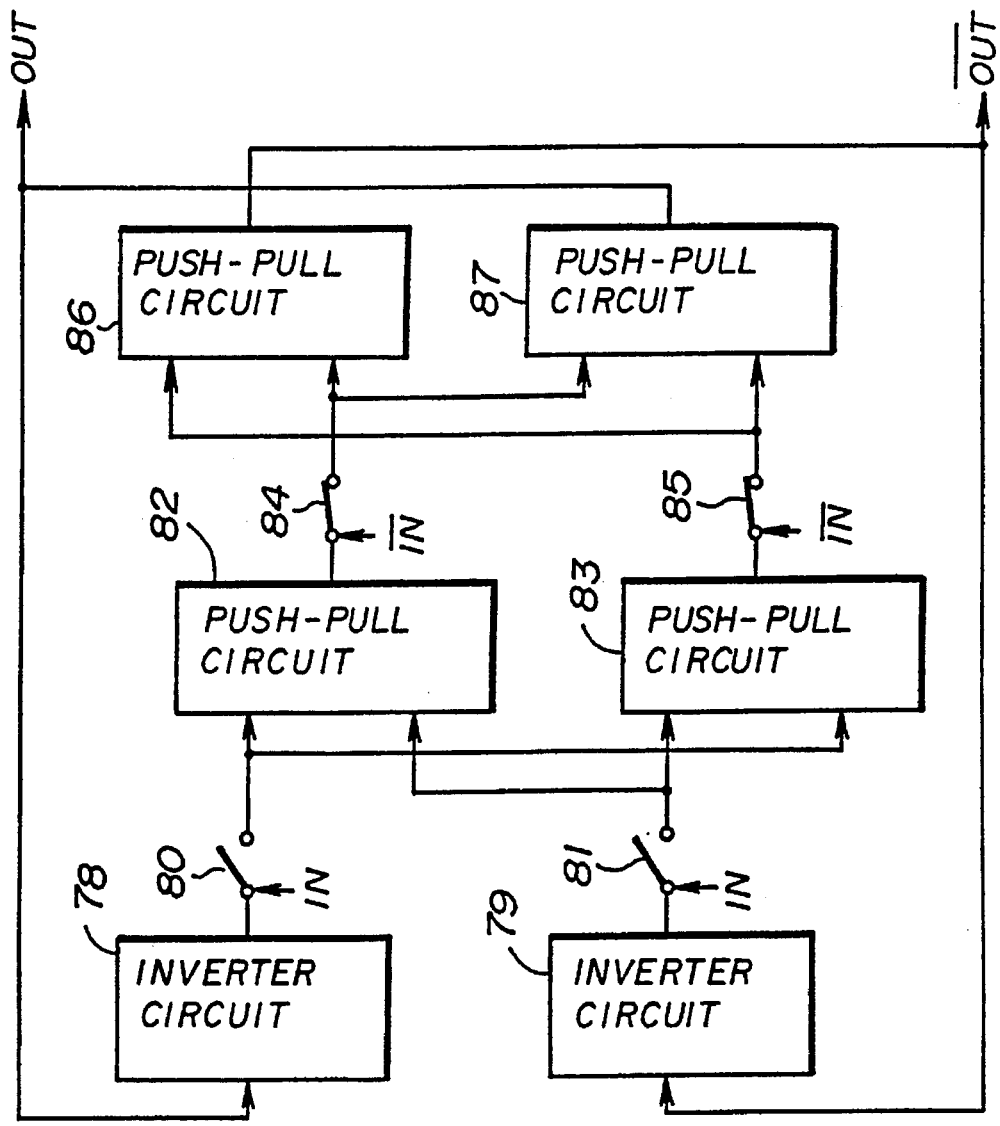
FIG. 4 is a block diagram of a first principle of the present invention.

FIG. 4 is a block diagram of a first principle of the present invention. A frequency dividing circuit according to the first principle includes inverter circuits 78 and 79, switch elements 80 and 81, push-pull circuits 82 and 83, switch elements 84 and 85, and push-pull circuits 86 and 87.

The inverter circuit 78 receives a frequency-divided signal output to an output terminal of a given internal circuit, for example, a frequency-divided signal OUT output by the push-pull circuit 87. The inverter circuit 79 receives the inverted version $\overline{OUT}$ of the frequency-divided signal OUT. This inverted version $\overline{OUT}$ is obtained at an output terminal of the push-pull circuit 86 or the inverter circuit 78.

The switch element 80 is turned ON and OFF in response to the input signal IN, and controls passage of the output signal of the inverter circuit 78. The switch element 81 is turned ON and OFF in response to the input signal IN, and controls passage of the output signal of the inverter circuit 79.

The push-pull circuit 82 is supplied, as control signals, with output signals of the inverter circuits 78 and 79 via the switch elements 80 and 81, respectively. The push-pull circuit 83 is supplied, as control signals, with the output signals 78 and 79 via the switch elements 80 and 81, respectively, and operates in the way counter to that of the push-pull circuit 82. More particularly, the push-pull circuit 83 performs the pull-down operation when the push-pull circuit 82 performs the pull-up operation, and performs the pull-up operation when the push-pull circuit 82 performs the pull-down operation.

The switch element 84 is turned ON and OFF by the inverted version $\overline{IN}$ of the input signal IN, and controls passage of the output signal of the push-pull circuit 82. The switch element 85 is turned ON and OFF by the inverted version $\overline{IN}$, and controls passage of the output signal of the push-pull circuit 83.

The push-pull circuit 86 is supplied, as control signals, with the output signals of the push-pull circuits 82 and 83 via the switch elements 84 and 85, respectively, and outputs the frequency-divided output signal $\overline{OUT}$. The push-pull circuit 87 is supplied, as control signals, with the output signals of the push-pull circuits 82 and 83 via the switch elements 84 and 85, and operates in the way counter to that of the push-pull circuit 86. More particularly, the push-pull circuit 87 performs the pull-down operation when the push-pull circuit 86 performs the pull-up operation, and performs the pull-up operation when the circuit 86 performs the pull-down operation.

It can be seen from the above that a pair of switch elements 80 and 81 and a pair of switch elements 84 and 85 are alternately turned ON in response to the signals IN and $\overline{IN}$, so that the complementary frequency-divided output signals OUT and $\overline{OUT}$ having a frequency half that of the signals IN and $\overline{IN}$ can be obtained at the outputs of the push-pull circuits 87 and 86. The inverter circuits 78 and 79 and the push-pull circuits 82, 83, 86 and 87 are provided as gate circuits, so that the whole frequency dividing circuit can be driven by a single power supply source and a relatively low power supply voltage. Furthermore, the currents do not always flow in the push-pull circuits 82, 83, 86 and 87, so that the frequency dividing circuit can consume a smaller amount of power.

It can be seen from the above description and illustration that a modified frequency dividing circuit capable of producing a frequency at a ratio equal to ½ can be obtained by cascading circuits each having the structure shown in FIG. 4.

Figure 5:
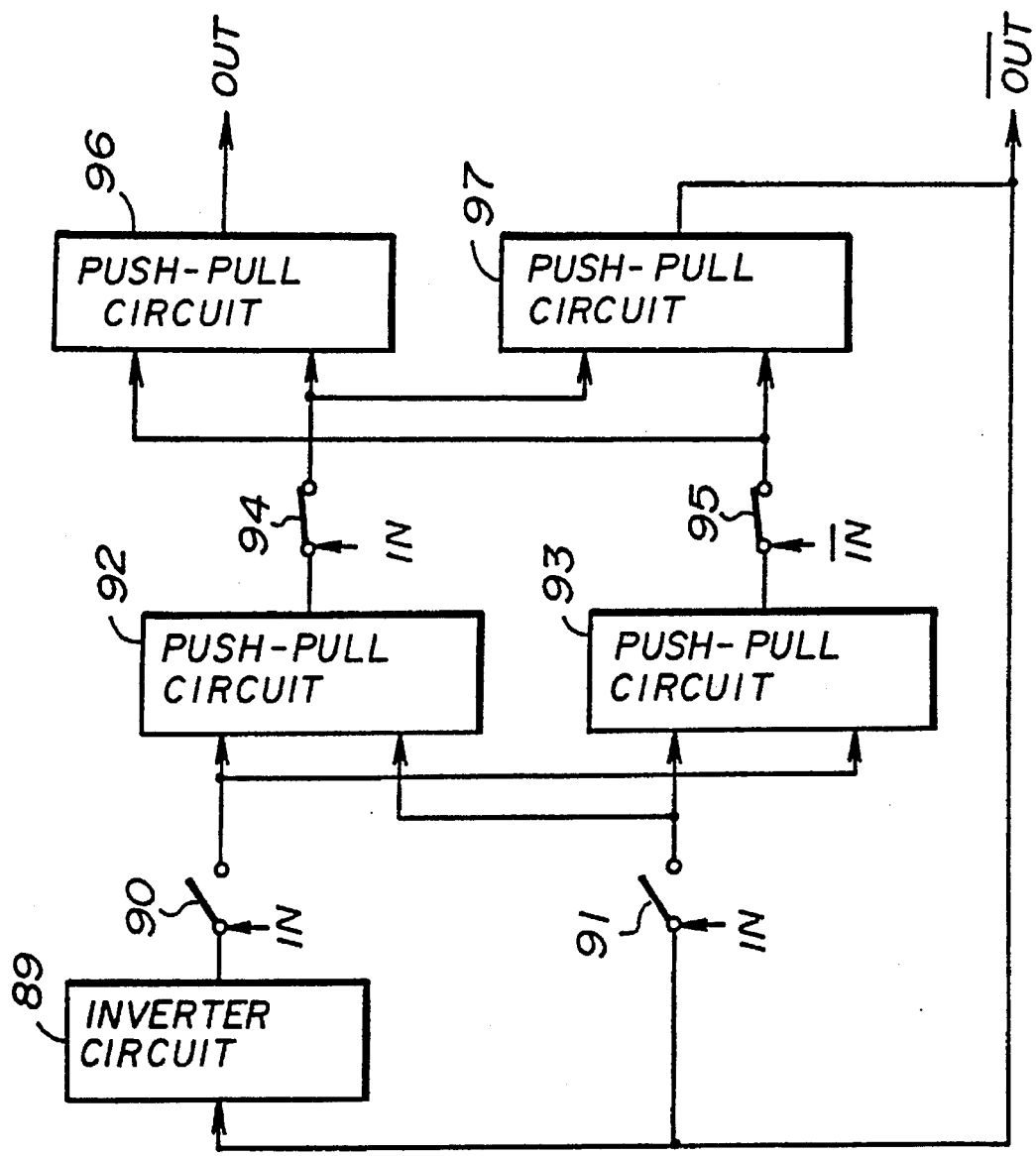
FIG. 5 is a block diagram of a second principle of the present invention.

FIG. 5 is a block diagram of a second principle of the present invention. A frequency dividing circuit utilizing the second principle of the present invention includes an inverter circuit 89, switch elements 90 and 91, push-pull circuits 92 and 93, switch elements 94 and 95, and push-pull circuits 96 and 97.

The inverter] circuit 89 is supplied with a frequency-divided signal output to an output terminal of a given internal circuit, for instance, a frequency-divided signal $\overline{OUT}$ output by the push-pull circuit 97. The switch element 90 is turned ON and OFF in response to the input signal IN, and controls passage of the output signal of the inverter circuit 89. The switch 91 is turned ON and OFF in response to the input signal IN, and controls passage of a frequency-divided output signal $\overline{OUT}$.

The push-pull circuit 92 is supplied, as control signals, with the output signal of the inverter 89 and the frequency-divided signal $\overline{\text{OUT}}$ via the switch elements 90 and 91, respectively. The push-pull circuit 93 is supplied, as control signals, with the output signal of the inverter circuit 89 and the frequency-divided signal $\overline{\text{OUT}}$ via the switch elements 90 and 91, respectively, and performs in the way counter to that of the push-pull circuit 92. More particularly, the push-pull circuit 93 performs the pull-down operation when the push-pull circuit 92 performs the pull-up operation, and performs the pull-up operation when push-pull circuit 92 performs the pull-down operation.

The switch element 94 is turned ON and OFF in response to the inverted version $\overline{\text{IN}}$ of the input signal IN, and controls passage of the output signal of the push-pull circuit 92. The switch element 95 is turned ON and OFF, and controls passage of the output signal of the push-pull circuit 93.

The push-pull circuit 96 is supplied, as control signals, with the output signals of the push-pull circuits 92 and 93 via the switch elements 94 and 95, respectively, and controls passage of the frequency-divided signal OUT having the inverted relationship to the signal $\overline{\text{OUT}}$. The push-pull circuit 97 is supplied, as control signals, with the output signals of the push-pull circuits 92 and 93 via the switch elements 94 and 95, and performs the operation counter to that of the push-pull circuit 96. More particularly, the push-pull circuit 97 performs the pull-down operation when the push-pull circuit 96 performs the pull-up operation, and performs the pull-up operation when the circuit 96 performs the pull-down operation.

It can be seen from the above that a pair of switch elements 90 and 91 and a pair of switch elements 94 and 95 are alternately turned ON in response to the signals IN and $\overline{\text{IN}}$, so that the complementary frequency-divided output signals OUT and $\overline{\text{OUT}}$ having a frequency half that of the signals IN and $\overline{\text{IN}}$ can be obtained at the outputs of the push-pull circuits 97 and 96. The inverter circuit 89 and the push-pull circuits 92, 93, 96 and 97 are provided as gate circuits, so that the whole frequency dividing circuit can be driven by a single power supply source and a relatively low power supply voltage. Furthermore, the currents do not always flow in the push-pull circuits 92, 93, 96 and 97, so that the frequency dividing circuit can consume a smaller amount of power.

According to the second principle of the present invention, there is provided only one inverter circuit, and hence the amount of power consumed is smaller than that consumed in the first-principle configuration.

It can be seen from the above description and illustration that a modified frequency dividing circuit capable of producing a frequency at a ratio equal to ½ can be obtained by cascading circuits each having the structure shown in FIG. 5.

A description will now be given, with reference to FIGS. 6 through 12, of a first embodiment of the present invention based on the aforementioned first principle. The circuit shown in FIG. 6 includes DCFL circuits 108 and 109 forming E/D inverter circuits. The DCFL circuits 108 and 109 include MESFETs 110 and 111 of the depletion type serving as load elements, and MESFETs 112 and 113 of the enhancement type serving as driving elements.

The frequency dividing circuit includes push-pull circuits 114–117, MESFETs 118–121 of the enhancement type functioning as pull-up elements, and MESFETs 122–125 of the enhancement type functioning as pull-down elements. The circuit shown in FIG. 6 includes enhancement-type MESFETs 126–129. The MESFETs 126 and 127 are turned ON and OFF by the input signal IN, and the MESFETs 128 and 129 are turned ON and OFF by its inverted version $\overline{\text{IN}}$.

Figure 7:
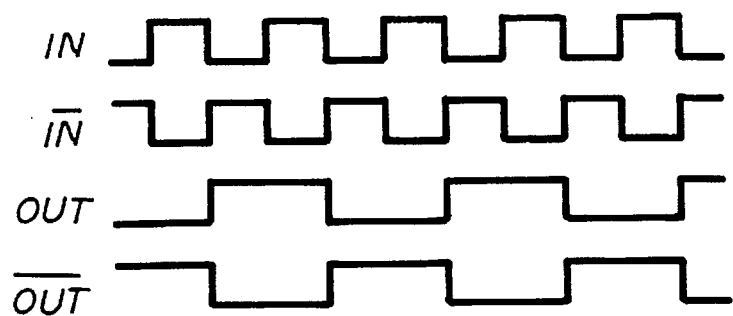
FIG. 7 is a waveform diagram of the operation of the first embodiment of the present invention.

According to the first embodiment of the present invention, the MESFETs 126 and 127 are alternately turned ON in response to the input signals IN and $\overline{\text{IN}}$, so that the complementary frequency-divided signals OUT and $\overline{\text{OUT}}$ having a frequency half that of the input signals IN and $\overline{\text{IN}}$ can be obtained at the outputs of the push-pull circuits 117 and 116, as shown in FIG. 7.

Figure 8:
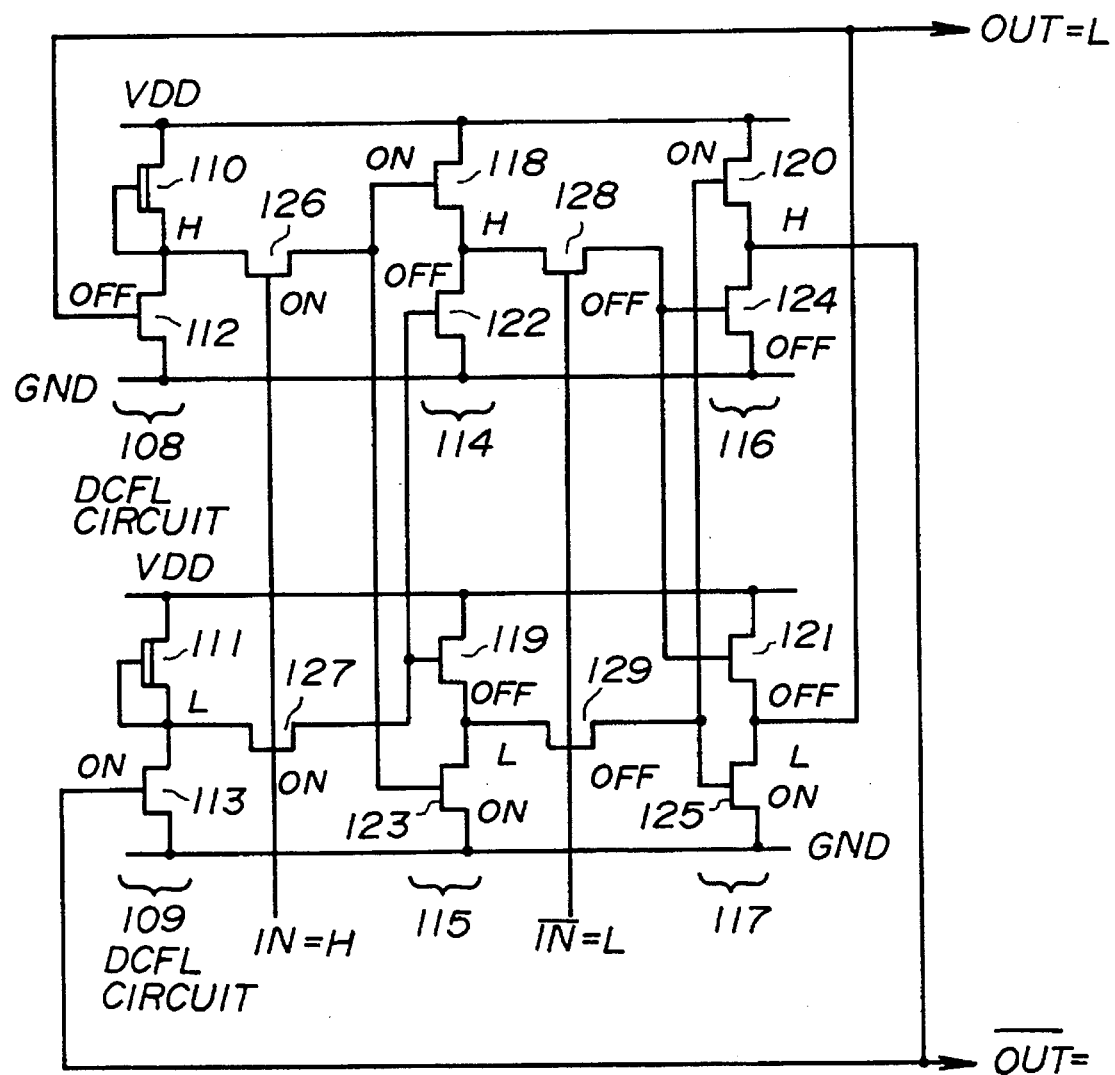
FIG. 8 is a circuit diagram showing the operation of the first embodiment of the present invention.

FIGS. 8 through 12 are circuit diagrams for describing the operation of the first embodiment of the present invention. FIG. 8 shows a case where the input signals IN and $\overline{\text{IN}}$ are high (H) and low (L), respectively, In this case, FIG. 8 shows that the MESFETs 126 and 127 are ON, and the MESFETs 128 and 129 are OFF while the frequency-divided signals OUT and $\overline{\text{OUT}}$ are low and high. In the above case, the MESFETs 120 and 124 in the push-pull circuit 116 are ON and OFF, respectively, while the MESFETs 121 and 125 are OFF and ON, respectively. In the DCFL circuit 108, the MESFET 112 is OFF and the output signal of the DCFL circuit 108 is high. In the DCFL circuit 109, the MESFET 113 is ON and the DCFL circuit 109 is low. Hence, in the push-pull circuit 114, the MESFETs 118 and 122 are ON and OFF, respectively, and the output signal of the push-pull circuit 114 is high.

In the push-pull circuit 115, the MESFETs 119 and 123 are OFF and ON, respectively, and the output signal of the push-pull circuit 115 is low.

Figure 9:
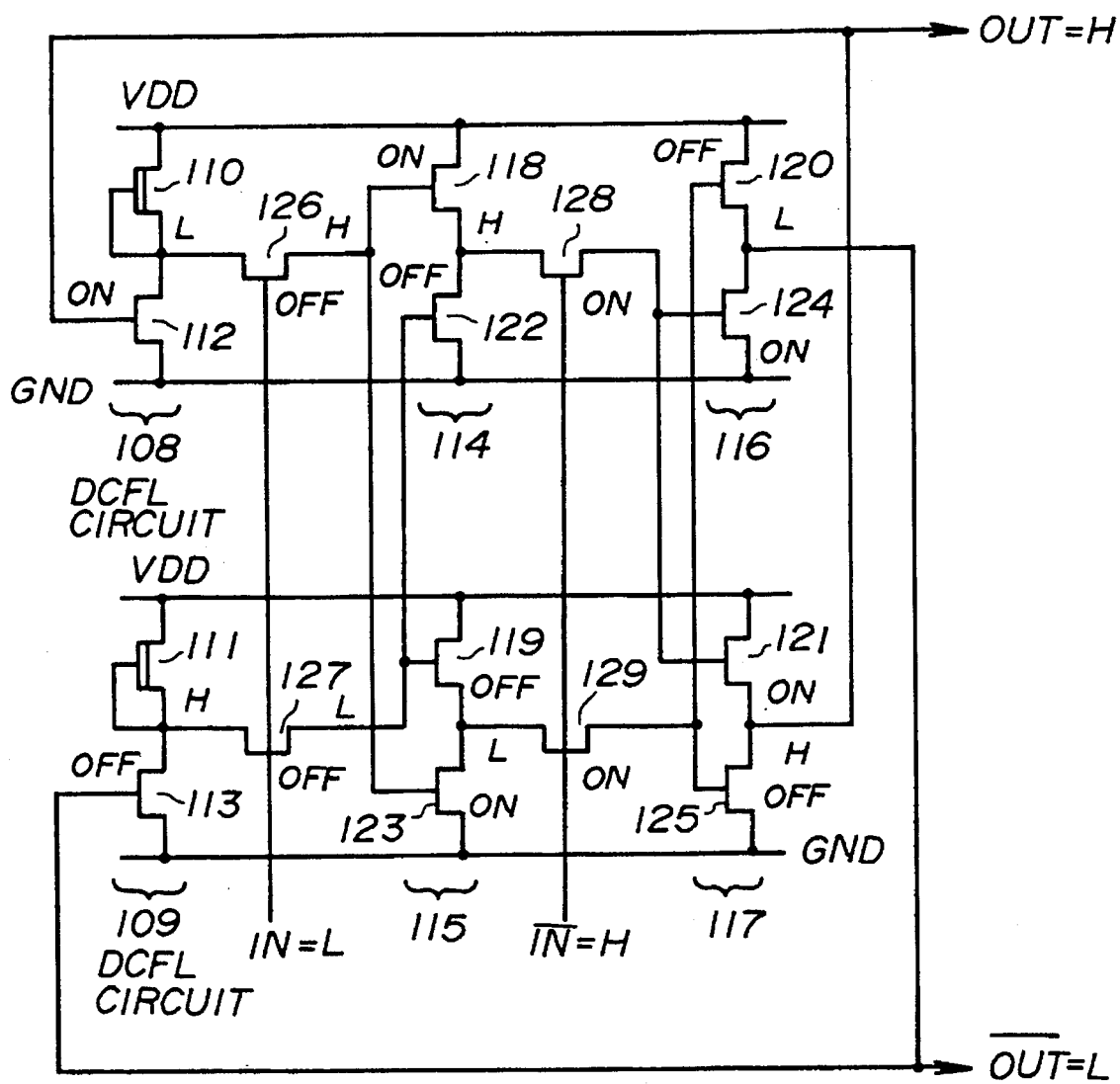
FIG. 9 is another circuit diagram showing the operation of the first embodiment of the present invention.

When the state of the circuit is changed from the above to a state shown in FIG. 9 in which the input signals IN and $\overline{\text{IN}}$ are low and high, respectively, the MESFETs 126 and 127 are OFF and the MESFETs 128 and 129 are ON. As a result, in the push-pull circuit 116, the MESFETs 120 and 124 are OFF and ON, respectively, and the output of the push-pull circuit 116 is low, that is, the frequency-divided output signal $\overline{\text{OUT}}$ is low.

In the push-pull circuit 117, the MESFETs 121 and 125 are ON and OFF, respectively, and the output of the push-pull circuit 117 are high, that is, the frequency-divided output signal OUT is high.

In the DCFL circuit 108, the MESFET 112 is ON and the output of the DCFL circuit 108 is low. In the DCFL circuit 109, the MESFET 113 is OFF and the output of the DCFL circuit 109 is high.

Figure 10:
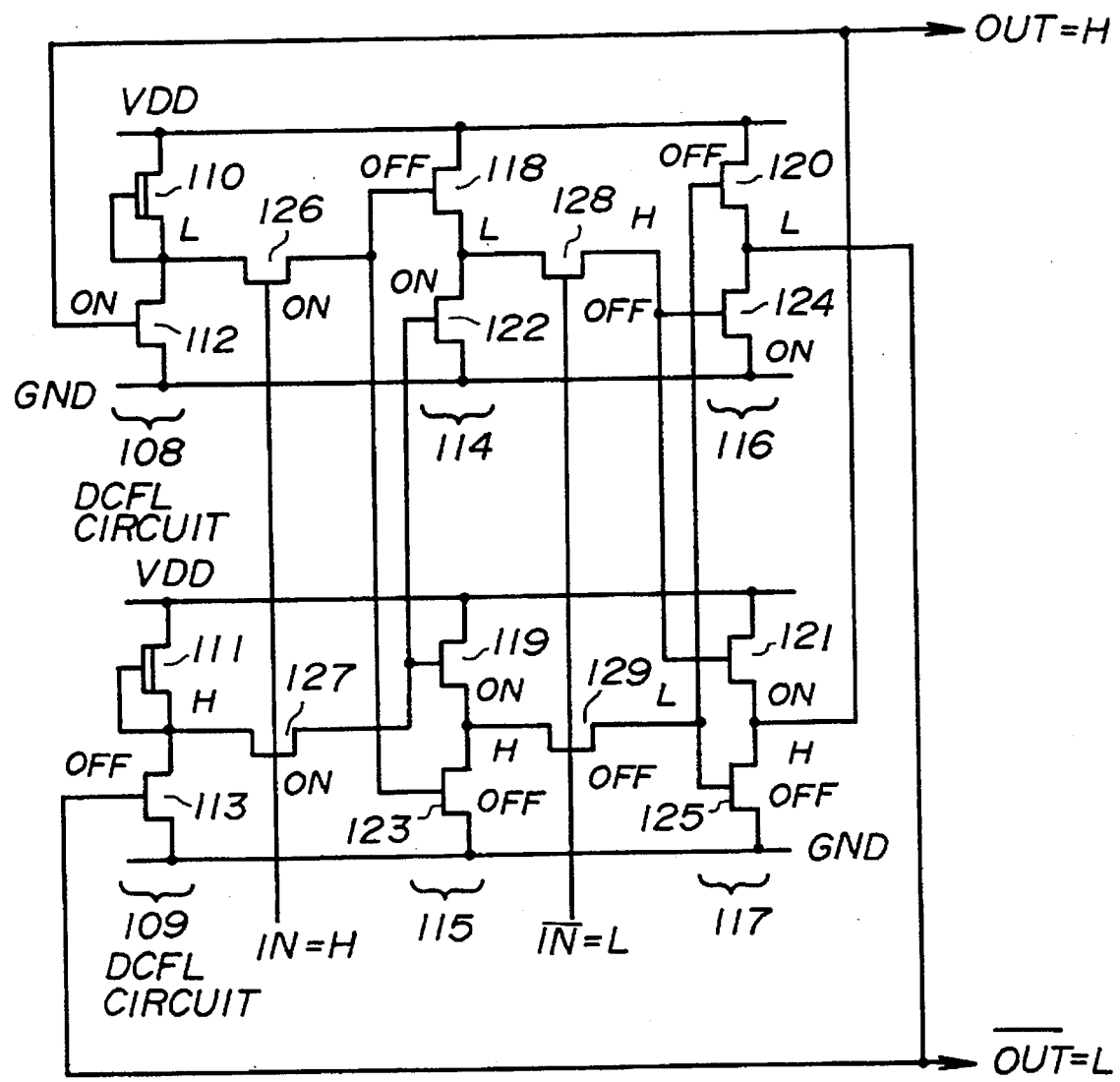
FIG. 10 is yet another circuit diagram showing the operation of the first embodiment of the present invention.

When the state of the circuit is changed from the above to a state shown in FIG. 10 in which the input signals IN and $\overline{\text{IN}}$ are high and low, the MESFETs 126 and 127 are ON and the MESFETs 128 and 129 are OFF. In this case, the output of the MESFET 128 is maintained at the high level, and the output of the MESFET 129 is maintained at the low level. Hence, in the push-pull circuit 116, the MESFETs 120 and 124 are maintained in the OFF and ON states, respectively, and the output of the push-pull circuit 116 is maintained at the low level, that is, the frequency-divided signal $\overline{\text{OUT}}$ is maintained at the low level.

In the push-pull circuit 117, the MESFETs 121 and 125 are maintained in the ON and OFF states, respectively, and the output signal of the push-pull circuit 117 is maintained at the high level, that is, the frequency-divided signal OUT is maintained at the high level. Hence, in the DCFL circuit 108, the output of the MESFETs 112 is maintained in the ON state and the output of the DCFL circuit 108 is at the low level. In the DCFL circuit 109, the MESFET 113 is maintained in the OFF state, and the output of the DCFL circuit 109 is maintained at the high level.

As a result, in the push-pull circuit 114, the MESFETs 118 and 122 are OFF and ON, respectively, and the output of the push-pull circuit 114 is low.

Inn the push-pull circuit 115, the MESFETs 119 and 123 are ON and OFF, respectively, and the output of the push-pull circuit 115 is high.

Figure 11:
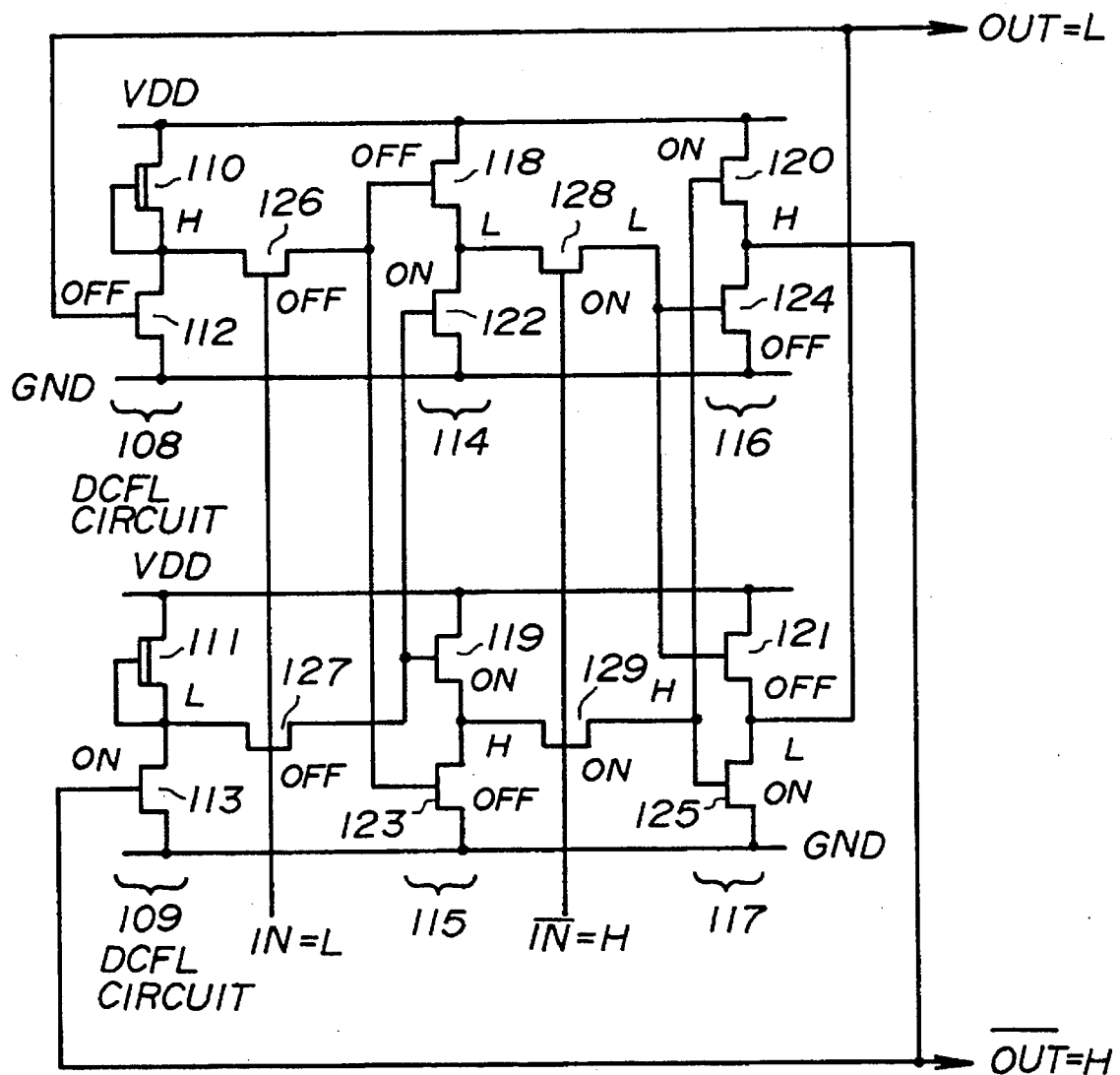
FIG. 11 is a further circuit diagram showing the operation of the first embodiment of the present invention.

When the state of the circuit is changed from the above to a state shown in FIG. 11, in which the input signals IN and $\overline{\text{IN}}$ are low and high, the MESFETs 126 and 127 are OFF and the MESFETs 128 and 129 are ON. As a result, in the push-pull circuit 116, the MESFETs 120 and 124 are ON and OFF, respectively, and the output of the push-pull circuit 116 is high, that is, the frequency-divided signal $\overline{\text{OUT}}$ is high. In the push-pull circuit 117, the MESFETs 121 and 125 are respectively OFF and ON, and the output of the push-pull circuit 117 is low, that is, the frequency-divided signal OUT is low. Hence, in the DCFL circuit 108, the MESFET 112 is OFF and the output of the DCFL circuit 108 is high. In the DCFL circuit 109, the MESFET 113 is ON and the output of the DCFL circuit 109 is low.

Figure 12:
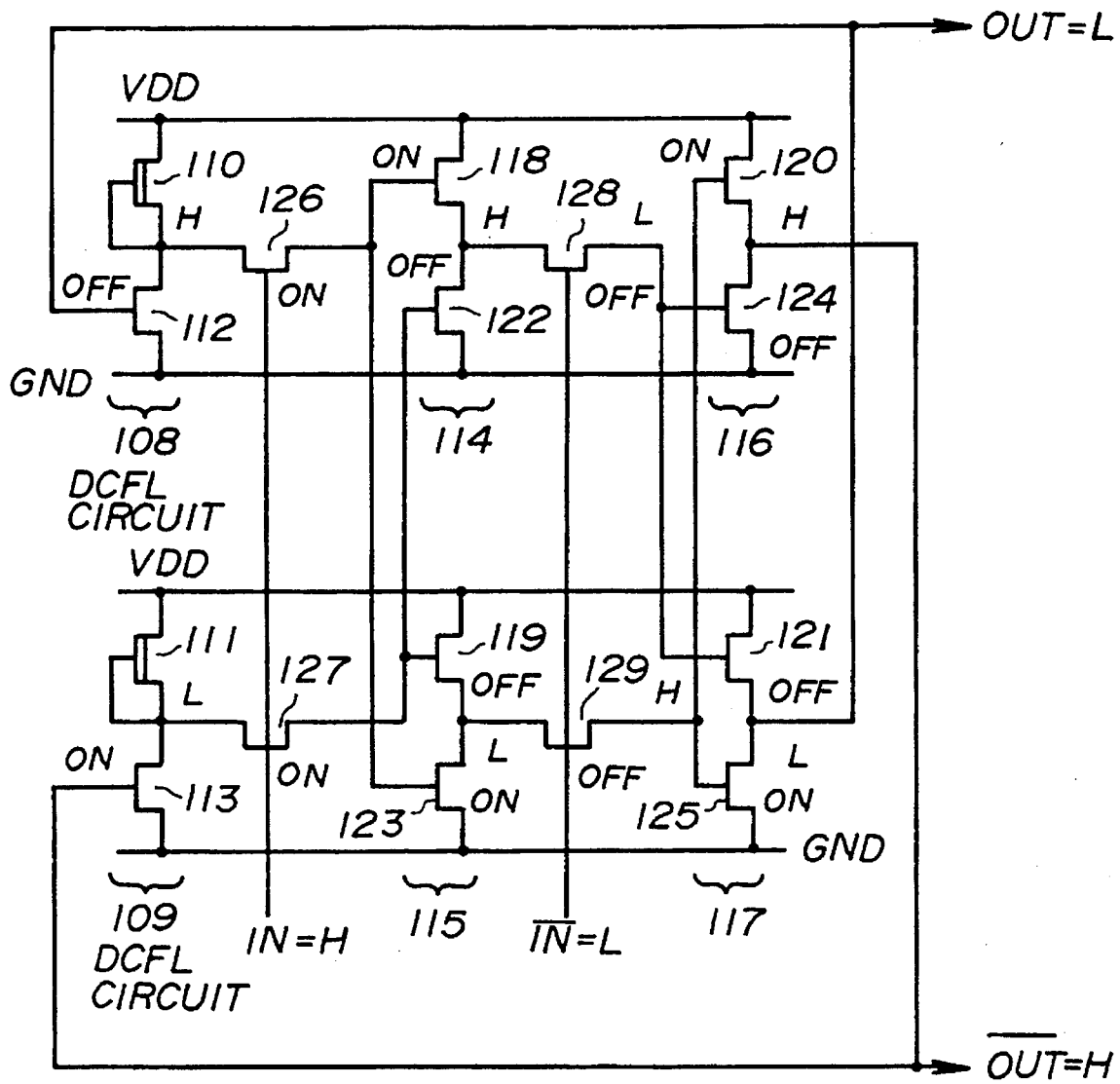
FIG. 12 is another circuit diagram showing the operation of the first embodiment of the present invention.

When the state of the circuit is changed from the above to a state shown in FIG. 12, in which the input signals IN and $\overline{\text{IN}}$ are high and low, respectively, the MESFETs 126 and 127 are ON and the MESFETs 128 and 129 are OFF. In this case, the output of the MESFET 128 is maintained at the low level, and the output of the MESFET 129 is maintained at the high level. Hence, in the push-pull circuit 116, the MESFETs 120 and 124 are maintained in the ON and OFF states, respectively, and the output of the push-pull circuit 116 is maintained at the high level, that is, the frequency-divided signal $\overline{\text{OUT}}$ is maintained at the high level. In the push-pull circuit 117, the MESFETs 121 and 125 are maintained in the OFF and ON states, respectively, and the output of the push-pull circuit 117 is maintained at the low level, that is, the signal OUT is maintained at the low level.

Hence, in the DCFL circuit 108, the MESFET 112 is maintained in the OFF state and the output of the DCFL circuit 108 is maintained at the high level. In the DCFL circuit 109, the MESFET 113 is maintained in the ON state, and the output of the DCFL circuit 109 is maintained at the low level. As a result, in the push-pull circuit 114, the MESFETs 118 and 122 are ON and OFF, respectively, and the output of the push-pull circuit 114 is high. In the push-pull circuit 115, the MESFETs 119 and 123 are OFF and ON, respectively, and the output of the push-pull circuit 115 is low.

That is, the frequency dividing circuit is returned to the state shown in FIG. 8. Then, the same operation is repeatedly performed. As a result, the complementary frequency-divided output signals $\overline{\text{OUT}}$ and OUT having a frequency half that of the signals IN and $\overline{\text{IN}}$ can be produced.

In the first embodiment of the present invention, there are provided, as gate circuits, the DCFL circuits 108 and 109 and the push-pull circuits 114–117. Hence, it is possible to drive the frequency dividing circuit by means of a single power supply source and a relatively low power supply voltage VDD equal to, for example, 1 volt.

The pass-through currents flow in the DCFL circuits 108 and 109 when the MESFETs 112 and 113 are ON, while no currents pass therethrough when the MESFETs 112 and 113 are OFF. This means that the currents do not always flow in the push-pull circuits 114–117. Hence, it is possible to reduce power consumed in the circuit.

According to the first embodiment of the present invention, it is possible to provide the frequency dividing circuit which can be driven by a single power supply source and a low power supply voltage and which consumes a smaller amount of power and output complementary frequency-divided output signals.

Figure 6:
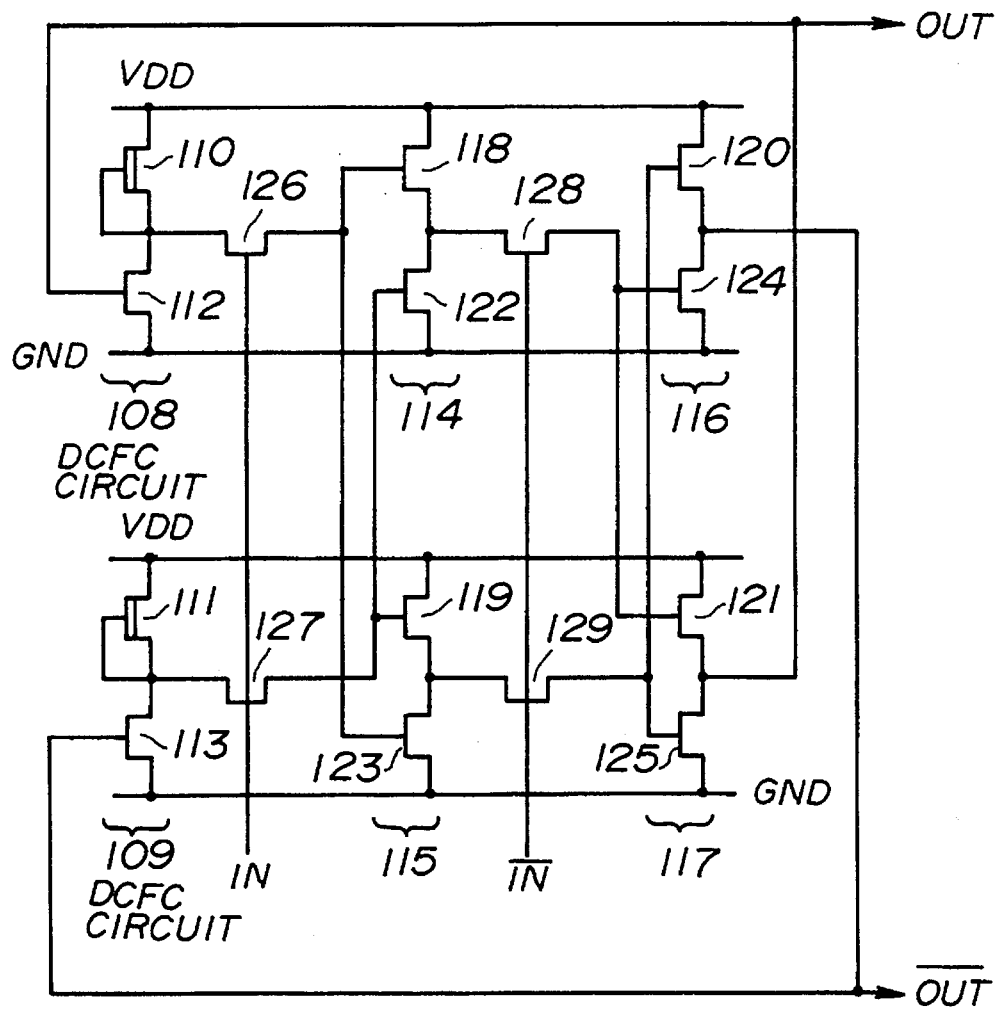
FIG. 6 is a circuit diagram of a first embodiment of the present invention.

A description will now be given, with reference to FIGS. 13–19, of a second embodiment of the present invention based on the aforementioned second principle. The second embodiment of the present invention differs from the first embodiment thereof as follows. The DCFL circuit 109 shown in FIG. 6 is deleted and supplying of the output signal of the push-pull circuit 116 to the MESFET 113 of the DCFL circuit 109 is stopped. The circuit is arranged so that the frequency-divided output signal OUT is obtained from the push-pull circuit 116. The output signal of the push-pull circuit 117 is supplied not only to the MESFET 112 of the DCFL circuit 108 but also to the input side of the MESFET 127. The other parts of the second embodiment of the present invention are substantially the same as those of the first embodiment thereof.

Figure 14:
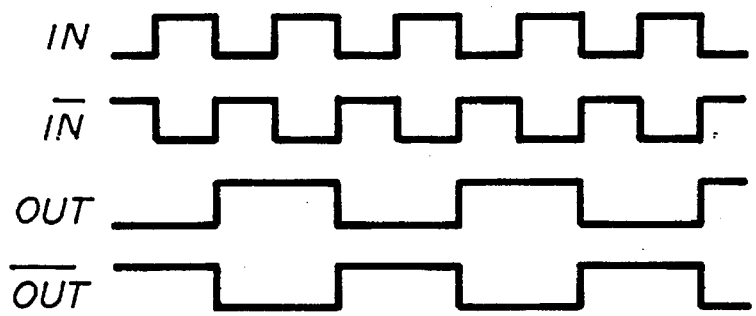
FIG. 14 is a waveform diagram of the operation of the second embodiment of the present invention.

According to the second embodiment of the present invention, the pair of MESFETs 126 and 127 and the pair of MESFETs 128 and 129 are alternately turned ON in response to the input signals IN and $\overline{\text{IN}}$, whereby the complementary frequency-divided output signals OUT and $\overline{\text{OUT}}$ having a frequency half that of the input signals IN and $\overline{\text{IN}}$ can be obtained at the outputs of the push-pull circuits 116 and 117, as shown in FIG. 14.

Figure 15:
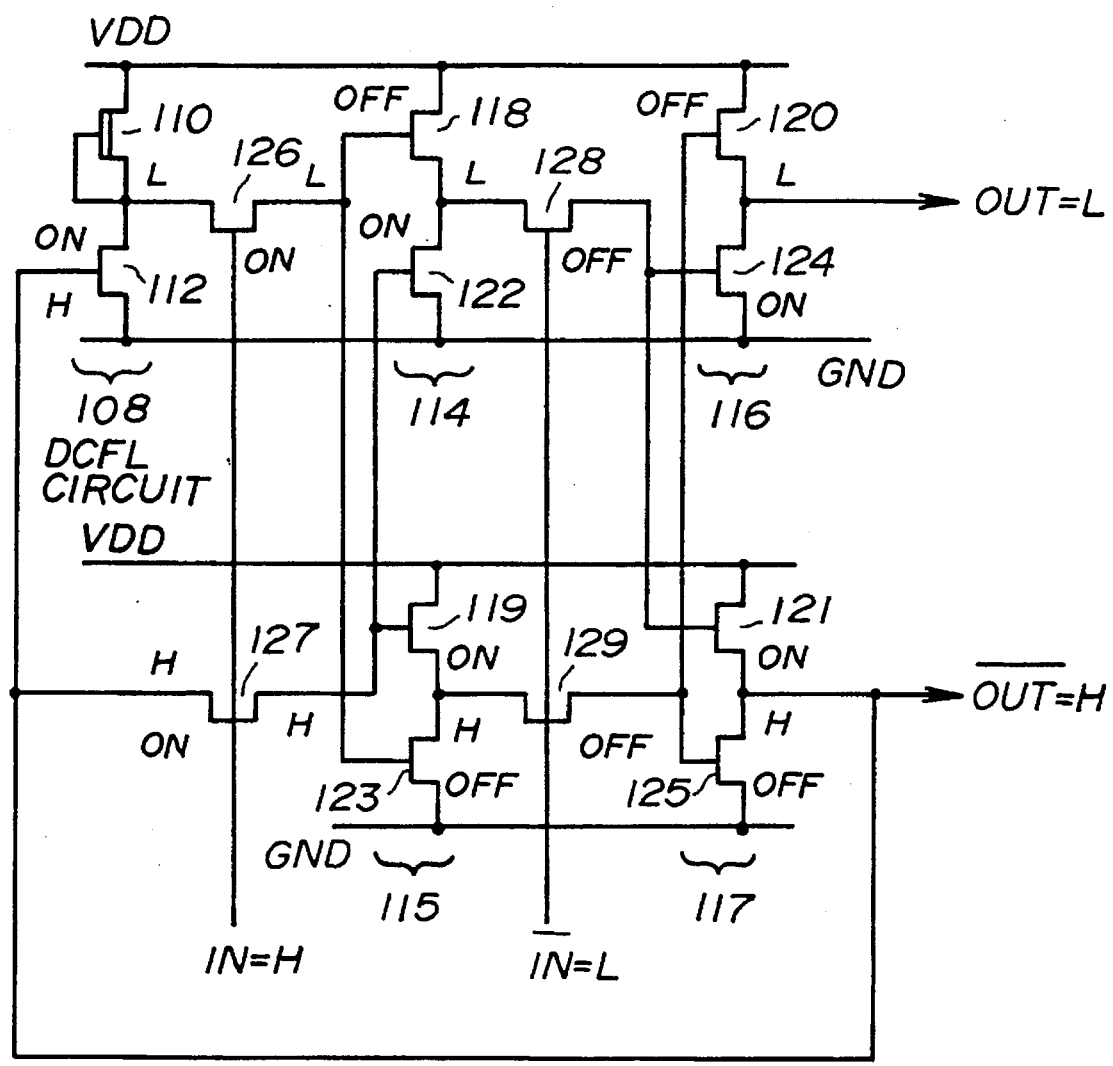
FIG. 15 is a circuit diagram showing the operation of the second embodiment of the present invention.

FIGS. 15 through 19 are diagrams which describe the operation of the second embodiment of the present invention. FIG. 15 shows a case where the input signals IN and $\overline{\text{IN}}$ are high and low, respectively. In this case, the MESFETs 126 and 127 are ON and the MESFETs 128 and 129 are OFF. The frequency-divided signals OUT and $\overline{\text{OUT}}$ are respectively low and high.

In the above case, the MESFETs 120 and 124 of the push-pull circuit 116 are OFF and ON, respectively. In the push-pull circuit 117, the MESFETs 121 and 125 are ON and OFF, respectively. In the DCFL circuit 108, the MESFET 112 is ON, and the output of the DCFL circuit 108 is at the low level. Hence, in the push-pull circuit 114, the MESFETS 118 and 122 are OFF and ON, respectively, and the output of the push-pull circuit 114 is low. In the push-pull circuit 115, the MESFETs 119 and 123 are ON and OFF, respectively, and the output of the push-pull circuit 115 is high.

Figure 16:
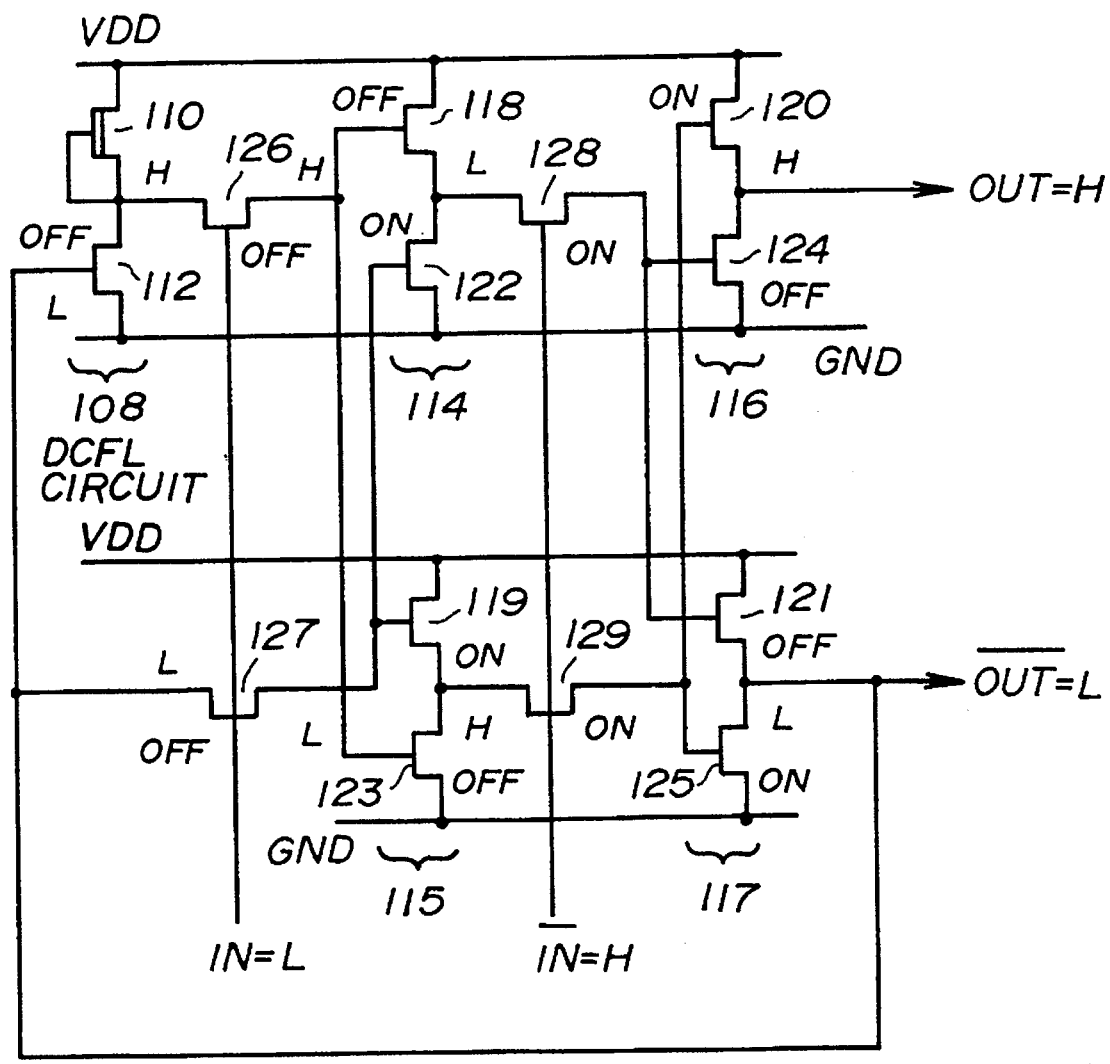
FIG. 16 is another circuit diagram showing the operation of the second embodiment of the present invention.

When the state of the frequency dividing circuit is changed from the above to a state shown in FIG. 16, in which the input signals IN and $\overline{\text{IN}}$ are low and high, respectively, the MESFETs 126 and 127 are OFF and the MESFETs 128 and 129 are ON. Hence, the MESFETs 120 and 124 of the push-pull circuit 116 are ON and OFF, respectively, and the output of the push-pull circuit 116 is high, that is, the frequency-divided signal OUT is high. In the push-pull circuit 117, the MESFETs 121 and 125 are OFF and ON, respectively, and the output of the push-pull circuit 117 is low, that is, the frequency-divided signal $\overline{\text{OUT}}$ is low. In the DCFL circuit 108, the MESFET 112 is OFF, and the output of the DCFL circuit 108 is high.

Figure 17:
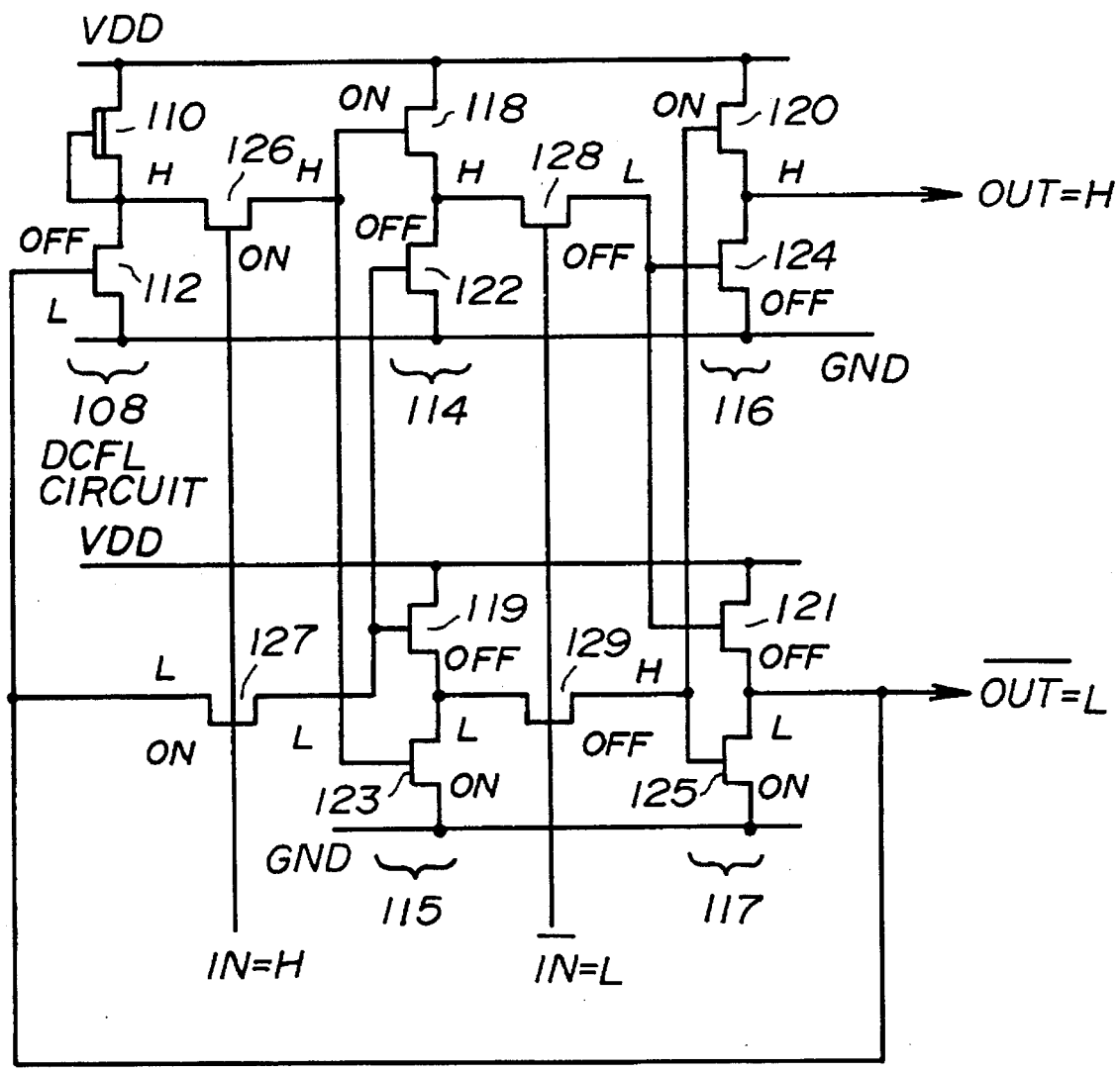
FIG. 17 is still another circuit diagram showing the operation of the second embodiment of the present invention.

When the state of the frequency dividing circuit is changed from the above to a state shown in FIG. 17, in which the input signals IN and $\overline{\text{IN}}$ are high and low, respectively, the MESFETs 126 and 127 are ON, and the MESFETs 128 and 129 are OFF. In this case, the output of the MESFET 128 is maintained at the low level, and the output of the MESFET 129 is maintained at the high level. Hence, the MESFETs 120 and 124 of the push-pull circuit 116 are maintained in the ON and OFF states, respectively, and the output of the push-pull circuit 116, that is, the frequency-divided signal OUT is maintained at the high level. In the push-pull circuit 117, the MESFETs 121 and 125 are maintained in the OFF and ON states, respectively, and the output of the push-pull circuit 117, that is, the frequency-divided signal $\overline{\text{OUT}}$ is maintained at the low level.

In the DCFL circuit 108, the MESFET 112 is maintained in the OFF state, and the output of the DCFL circuit 108 is maintained at the high level. Hence, the MESFETs 118 and 122 of the push-pull circuit 114 are ON and OFF, respectively, and the output of the push-pull circuit 114 is high. In the push-pull circuit 115, the MESFETs 119 and 123 are OFF and ON, respectively, and the output of the push-pull circuit 115 is low.

Figure 18:
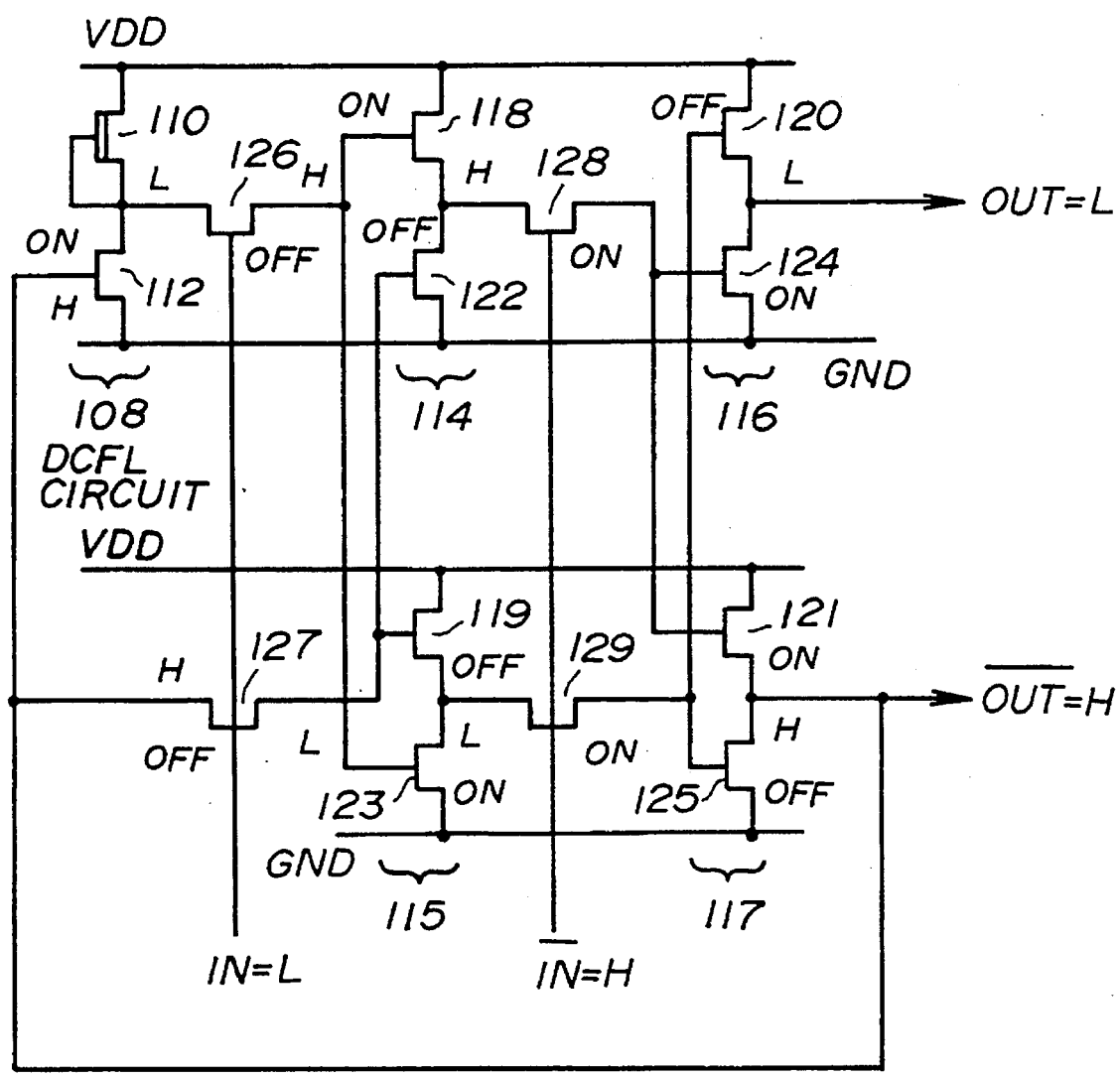
FIG. 18 is a further circuit diagram showing the operation of the second embodiment of the present invention.

When the state of the frequency dividing circuit is changed from the above to a state shown in FIG. 18, in which the input signals IN and $\overline{\text{IN}}$ are low and high, respectively, the MESFETs 126 and 127 are OFF, and the MESFETs 128 and 129 are ON. Hence, the MESFETs 120 and 124 of the push-pull circuit 116 are OFF and ON, respectively, and the output of the push-pull circuit 116, that is, the frequency-divided signal OUT is low. In the push-pull circuit 117, the MESFETs 121 and 125 are ON and OFF, respectively, and the output of the push-pull circuit 117, that is, the frequency-divided signal $\overline{\text{OUT}}$ is high. In the DCFL circuit 108, the MESFET 112 is ON and the output of the DCFL circuit 108 is low.

Figure 19:
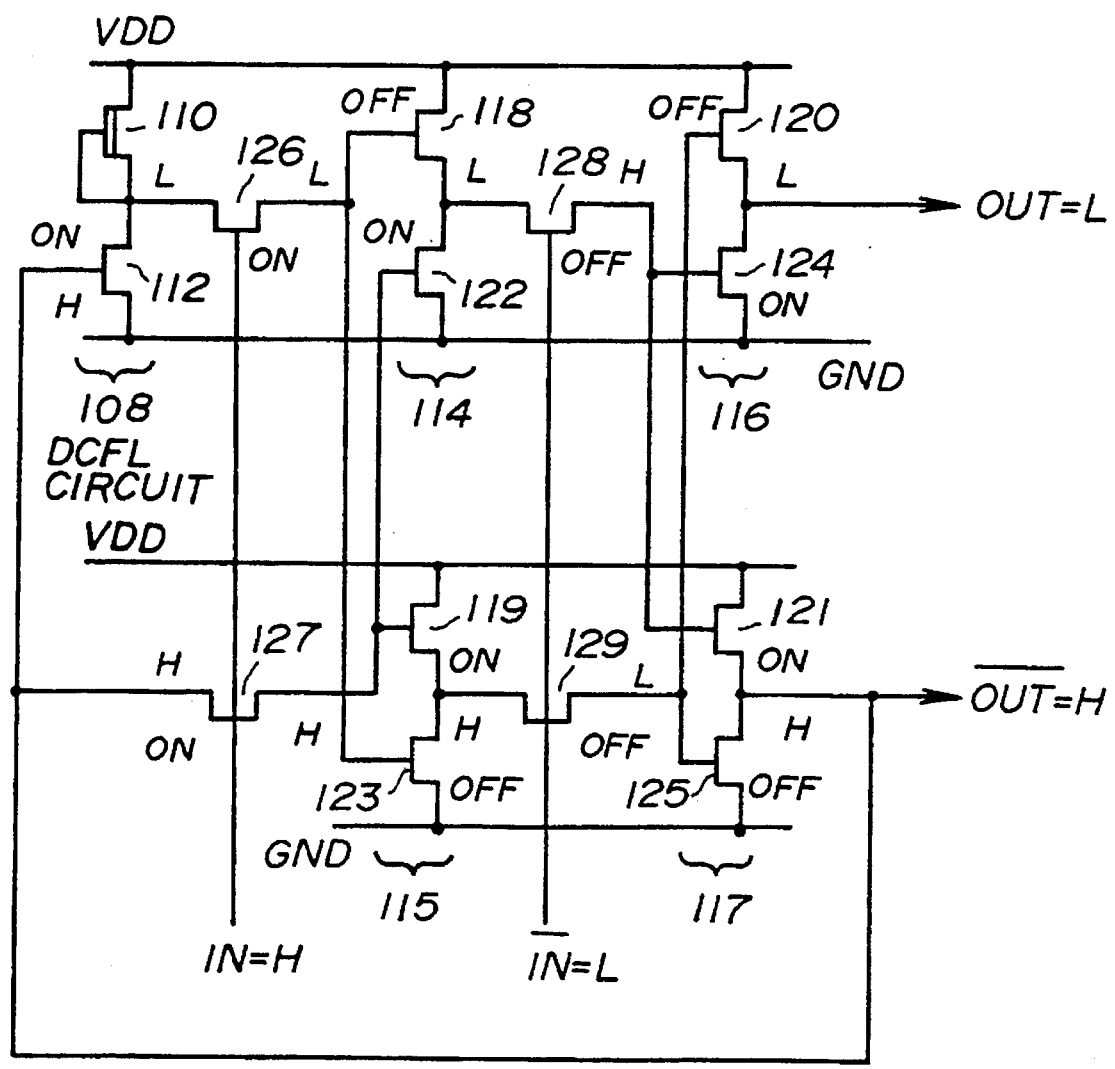
FIG. 19 is a still further circuit diagram showing the operation of the second embodiment of the present invention.

When the state of the frequency dividing circuit is changed from the above to a state shown in FIG. 19, in which the input signals IN and $\overline{\text{IN}}$ are respectively high and low, the MESFETs 126 and 127 are ON, and the MESFETs 128 and 129 are OFF. In this case, the output of the MESFET 128 is maintained at the high level, and the output of the MESFET 129 is maintained in the low level. Hence, the MESFETs 120 and 124 of the push-pull circuit 116 are maintained in the OFF and ON, respectively, and the output of the push-pull circuit 116, that is, the frequency-divided signal OUT is maintained at the low level. In the push-pull circuit 117, the MESFETs 121 and 125 are maintained in the ON and OFF states, respectively, and the output of the push-pull circuit 117, that is, the frequency-divided signal $\overline{\text{OUT}}$ is maintained at the high level.

In the DCFL circuit 108, the MESFET 112 is maintained in the ON state, and the output of the DCFL circuit 108 is maintained-at the-low level. Hence, in the push-pull circuit 114, the MESFETs 118 and 122 are OFF and ON, respectively, and the output of the push-pull circuit 114 is low. In the push-pull circuit 115, the MESFETs 119 and 123 are ON and OFF, respectively, and the output of the push-pull circuit 115 is high. That is, the state of the circuit is returned to the state shown in FIG. 15. Then, the same operation as described above is repeatedly carried out, so that the frequency-divided signals OUT and $\overline{\text{OUT}}$ having a frequency half that of the signals IN and $\overline{\text{IN}}$ can be obtained.

According to the second embodiment of the present invention, there are provided, as gate circuits, the DCFL circuit 108 and the push-pull circuits 114–117. Hence, the frequency dividing circuit can be driven by a single power supply source and a relatively low power supply voltage VDD equal to, for example, 1 volt.

In the DCFL circuit 108, when the MESFET 112 is ON, the pass-through currents flow therein. When the MESFET 112 is OFF, the pass-through currents do not always flow in the push-pull circuits 114–117. Hence, it is possible to reduce the amount of power consumed in the frequency dividing circuit.

According to the second embodiment of the present invention, it is possible to provide the frequency dividing circuit which can be driven by a single power supply source and a low power supply voltage and which consumes a smaller amount of power and output complementary frequency-divided output signals.

Particularly, the second embodiment of the present invention utilizes only one DCFL circuit, and consumes a smaller amount of power than the first embodiment thereof.

Figure 20:
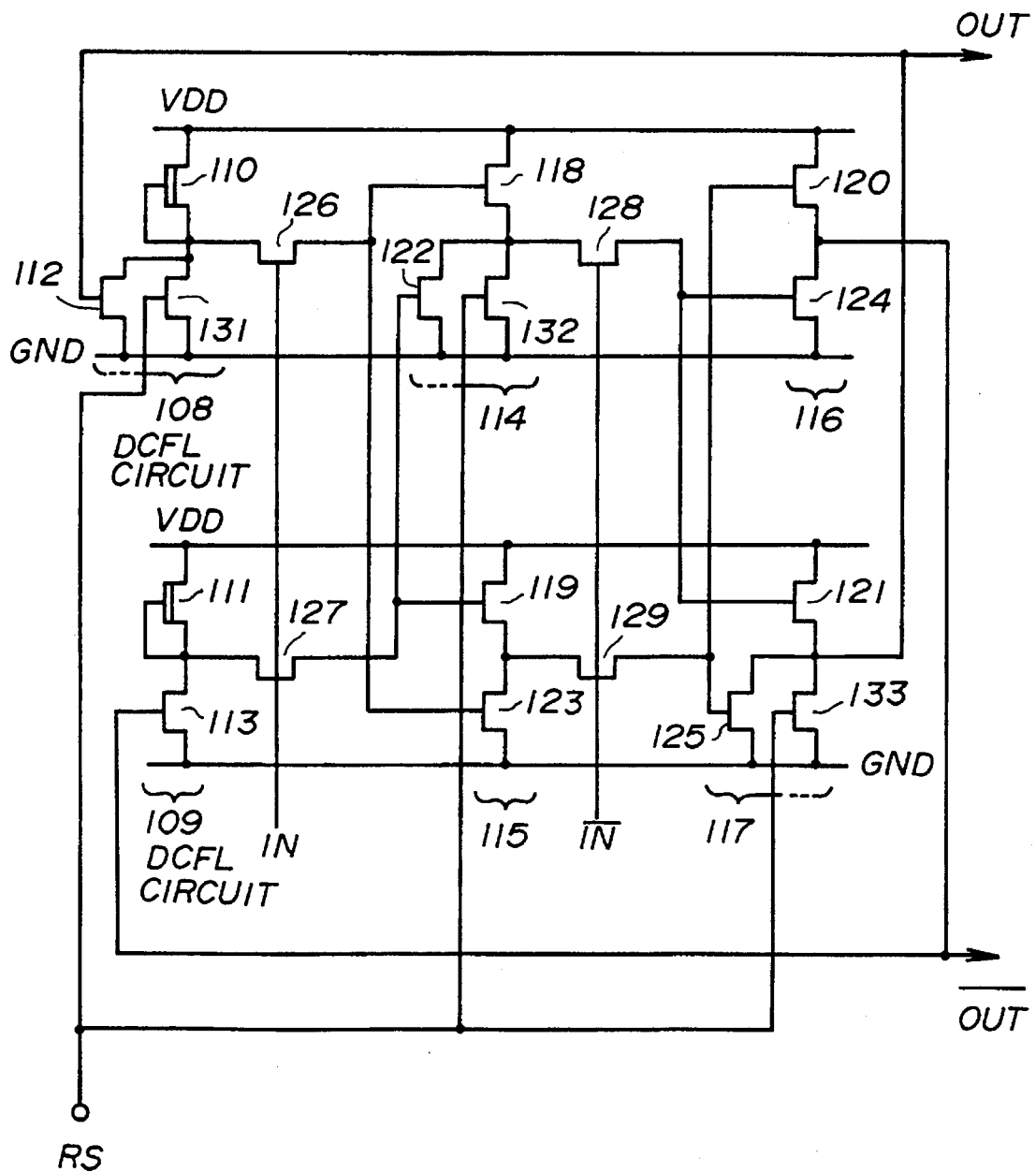
FIG. 20 is a circuit diagram of a third embodiment of the present invention.

A description will now be given, with reference to FIGS. 20–22, of a third embodiment of the present invention, which differs from the first embodiment thereof in that a reset function is given by additionally using enhancement-type MESFETs 131–133 controlled by a reset signal RS, as shown in FIG. 20. The other parts of the third embodiment of the present invention are the same as those of the first embodiment thereof.

Figure 21:
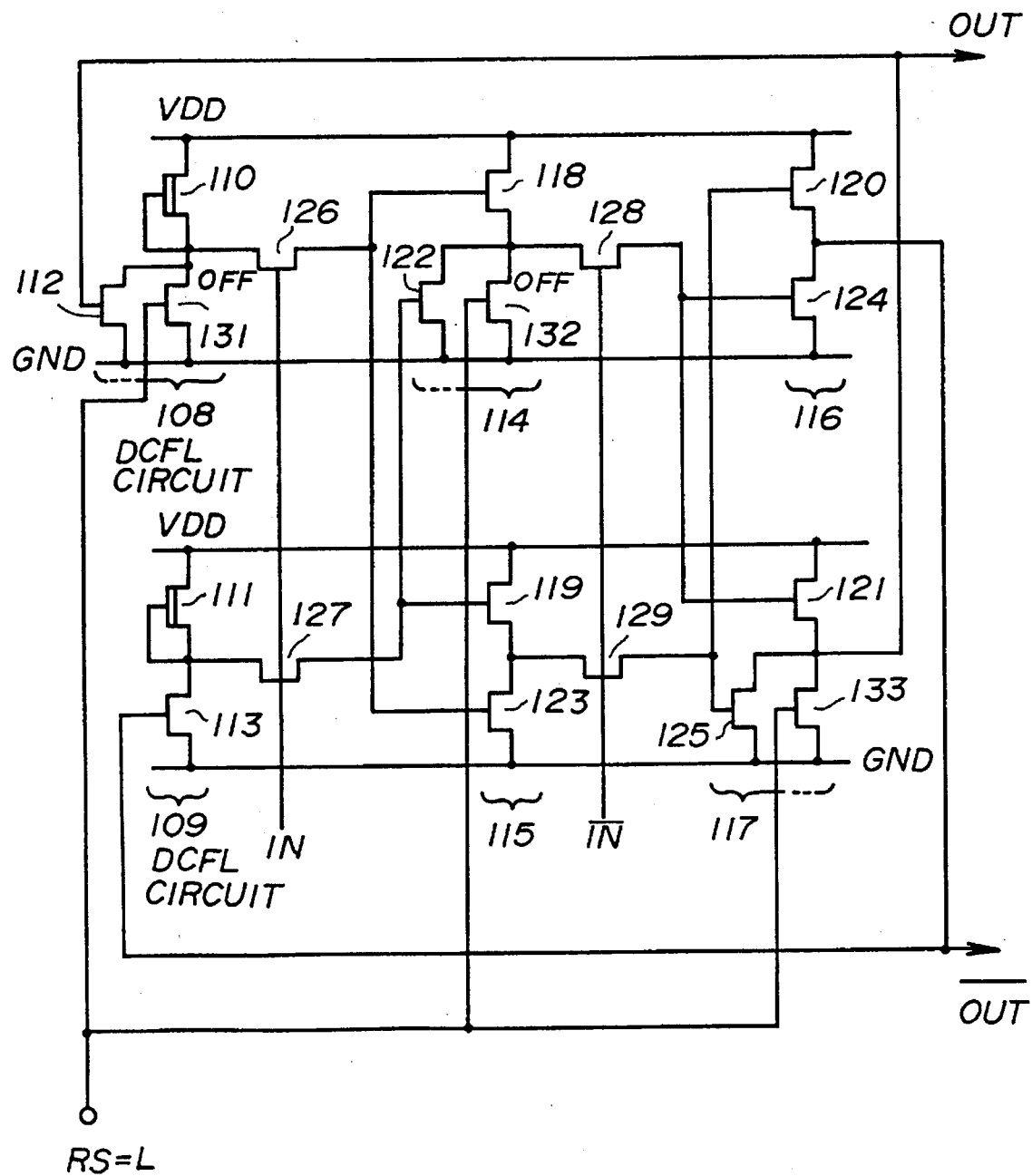
FIG. 21 is a circuit diagram showing the operation of the third embodiment of the present invention.

As shown in FIG. 21, when the reset signal RS is low, the MESFETs 131–133 are OFF. In this case, the third embodiment of the present invention is equivalent to the first embodiment thereof, and operates in the same way as the first embodiment.

Figure 22:
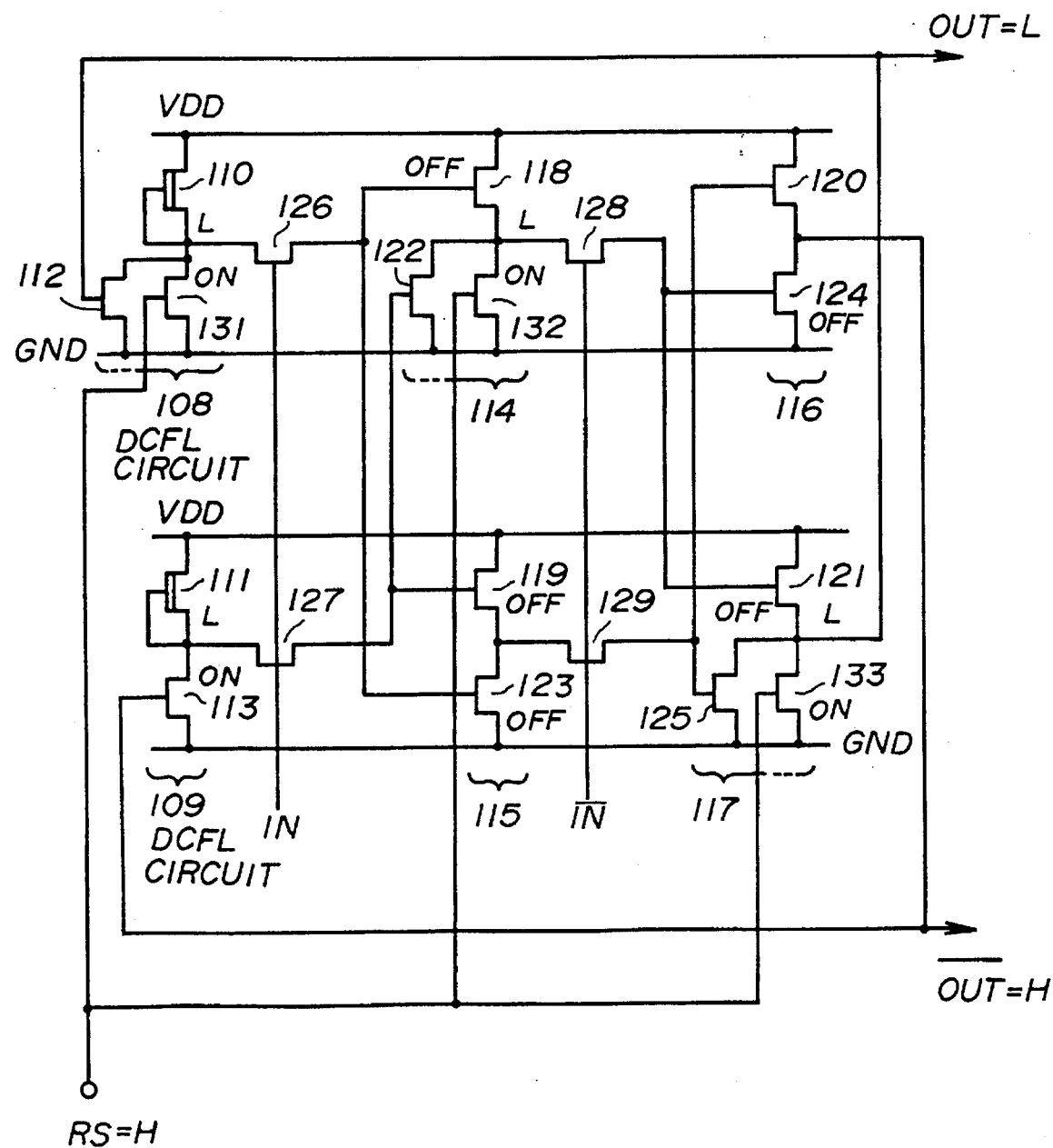
FIG. 22 is another circuit diagram showing the operation of the third embodiment of the present invention.

As shown in FIG. 22, when the reset signal RS is high, the MESFETs 131–133 are ON, and the output of the DCFL circuit 108 is low. Further, the MESFETs 118 and 123 are both OFF, and the output of the push-pull circuit 114 is low. Further, the MESFETs 124 and 121 are both OFF.

Hence, in the push-pull circuit 117, the MESFETs 121 and 133 are fixed to ON, and the output signal OUT is fixed to the low level (reset state) irrespective of whether the input signals IN and $\overline{\text{IN}}$ are high or low.

In the above case, if the output signal $\overline{\text{OUT}}$ is high, the MESFET 113 is ON and the output of the DCFL circuit 109 is low. Further, the MESFET 119 is OFF, and the output of the push-pull circuit 115 is in the high-impedance state.

According to the third embodiment of the present invention, it is possible to provide the frequency dividing circuit with the reset function which can be driven by a single power supply source and a low power supply voltage and which consumes a smaller amount of power and output complementary frequency-divided output signals.

Figure 23:
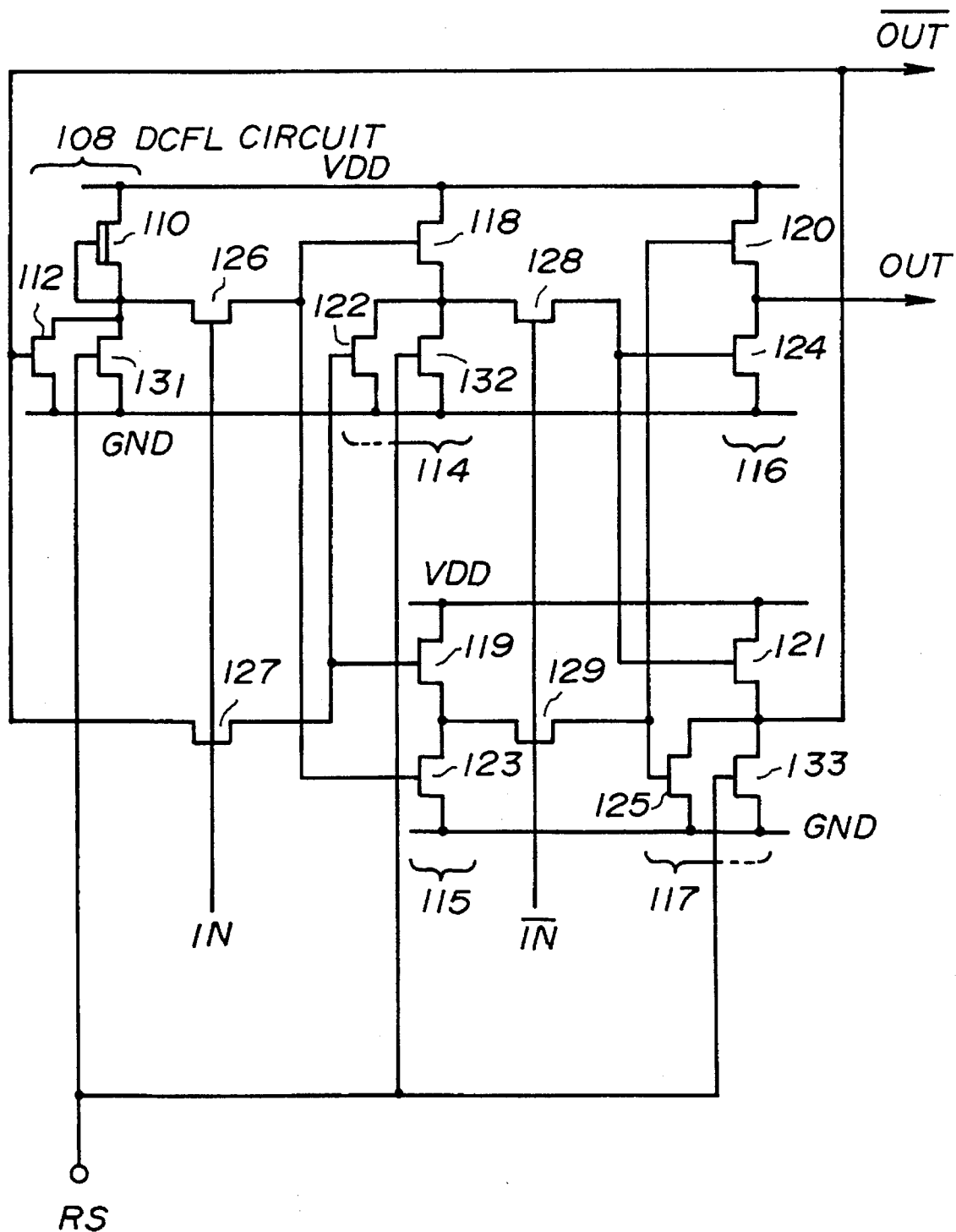
FIG. 23 is a circuit diagram of a fourth embodiment of the present invention.

A description will now be given, with reference to FIGS. 23–25, of a fourth embodiment of the present invention, which differs from the second embodiment thereof in that a reset function is added by providing enhancement-type MESFETs 131–133 controlled by the reset signal RS, as shown in FIG. 23. The other parts of the fourth embodiment of the present invention are substantially the same as those of the second embodiment thereof.

Figure 24:
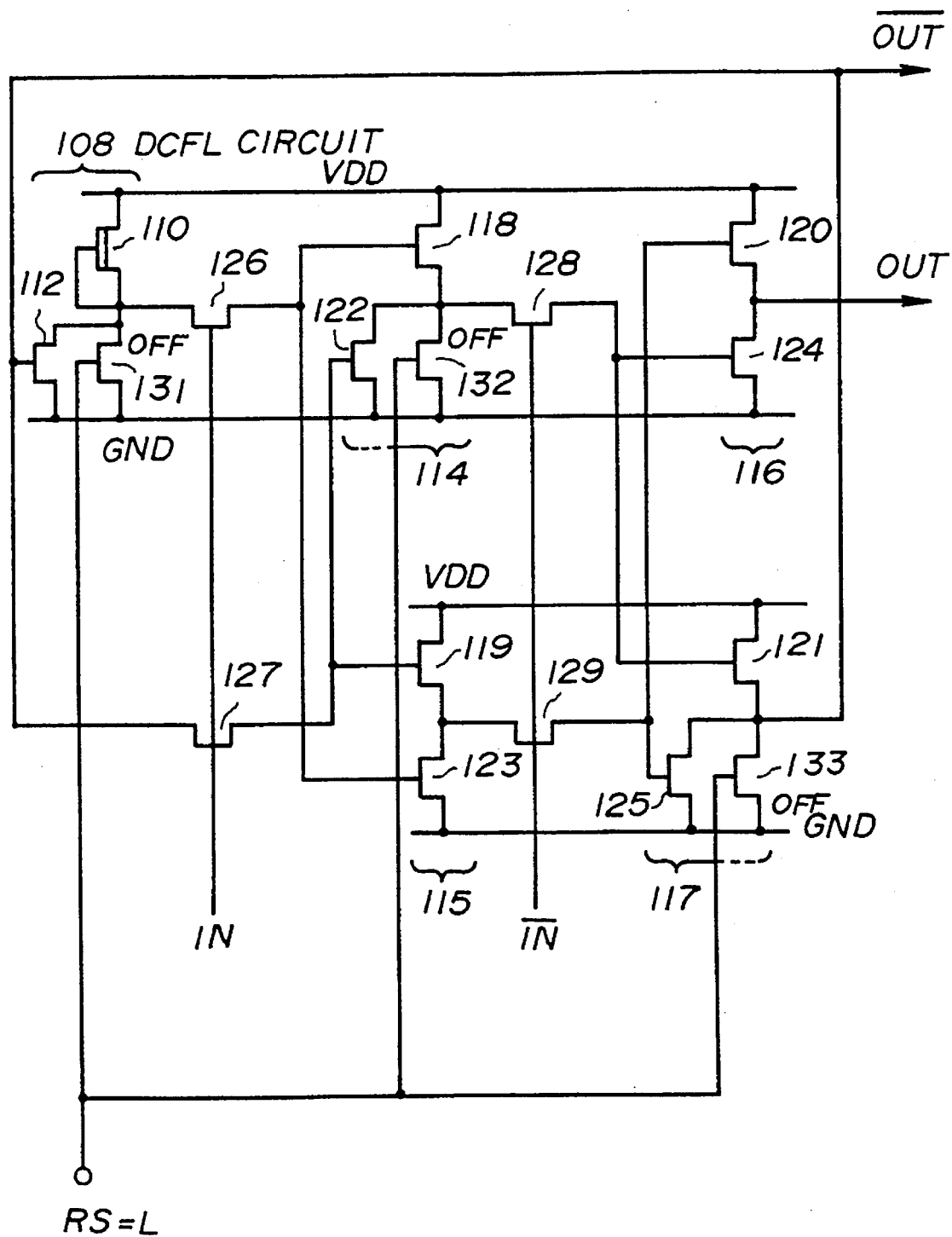
FIG. 24 is a circuit diagram showing the operation of the fourth embodiment of the present invention.

As shown in FIG. 24, when the reset signal RS is low, the MESFETs 131–133 are OFF. In this case, the fourth embodiment of the present invention is equivalent to the second embodiment thereof.

Figure 25:
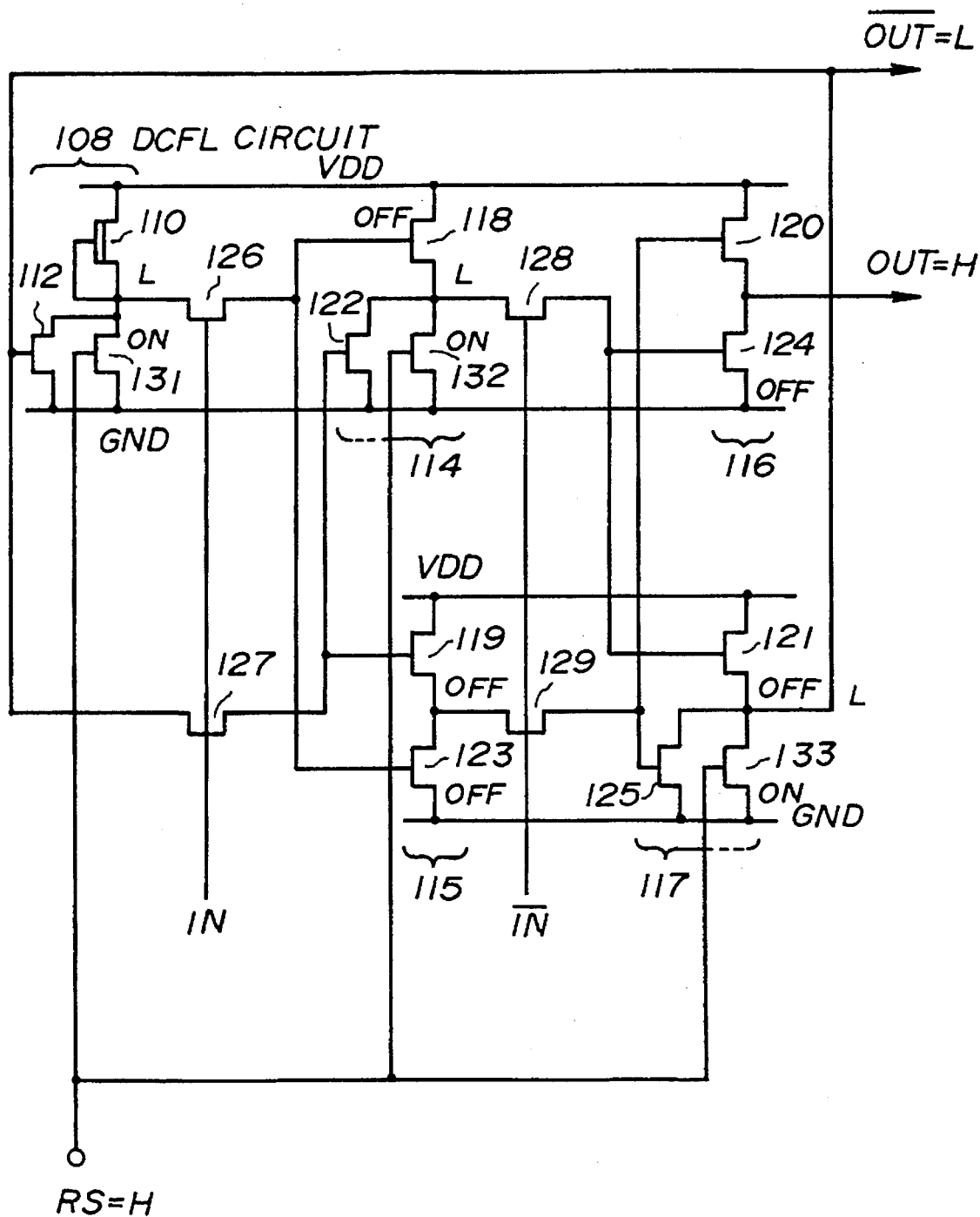
FIG. 25 is a circuit diagram showing the operation of the fourth embodiment of the present invention.

As shown in FIG. 25, when the reset signal RS is high, the MESFETs 131–133 are ON, and the output of the DCFL circuit 108 is low. The MESFETs 118 and 123 are both OFF, and the output of the push-pull circuit 114 is low. The MESFETs 124 and 121 are both OFF. Hence, in the push-pull circuit 117, the MESFET 121 is fixed to OFF, and the MESFET 133 is fixed to ON. Hence, the output signal $\overline{\text{OUT}}$ is fixed to the low level (reset state) irrespective of whether or not the input signals IN and $\overline{\text{IN}}$ are high or low.

According to the fourth embodiment of the present invention, it is possible to provide the frequency dividing circuit which can be driven by a single power supply source and a low power supply voltage and which consumes a smaller amount of power and output complementary frequency-divided output signals. Particularly, the fourth embodiment of the present invention utilizes only one DCFL circuit, and consumes a smaller amount of power than the first embodiment thereof.

A description will now be given of a fifth embodiment of the present invention with reference to FIG. 26. The fifth embodiment of the present invention is intended to provide a frequency dividing circuit in which the frequency dividing ratio can be adjusted to ¼ or ⅕ in accordance with a frequency dividing ratio switching control signal CL.

Figure 26:
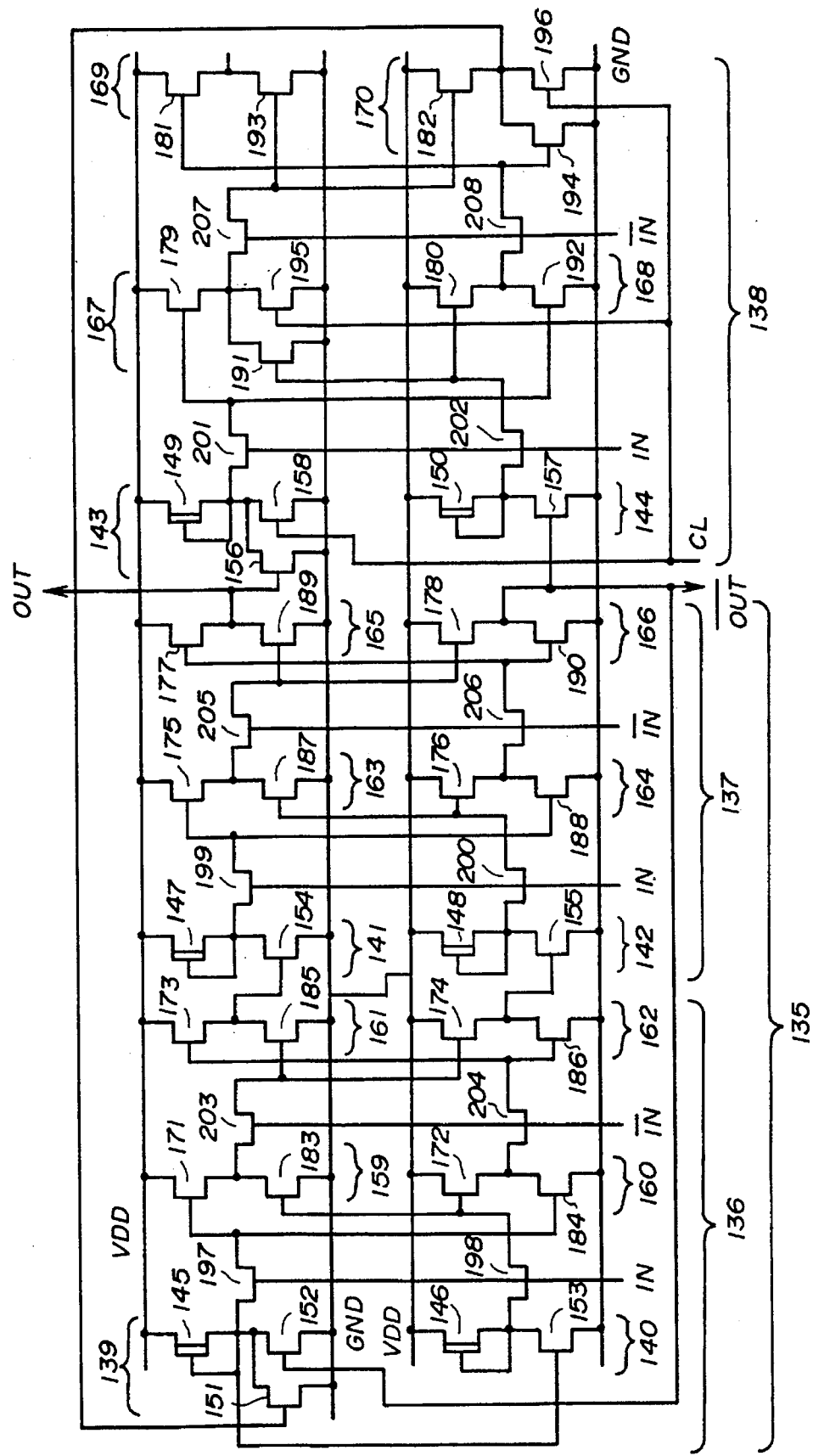
FIG. 26 is a circuit diagram of a fifth embodiment of the present invention.

In FIG. 26, there is provided a frequency dividing circuit formed by cascading frequency dividing circuits 136 and 137 each equivalent to the circuit of the first embodiment of the present invention shown in FIG. 6. There is also provided a frequency dividing circuit 138 equivalent to the circuit of the third embodiment of the present invention shown in FIG. 20.

The circuit shown in FIG. 26 includes DCFL circuits 139–144, depletion-type MESFETs 145–150 serving as load elements, enhancement-type MESFETs 151–157 functioning as driving elements, and an enhancement-type MESFET 158 for reset. The MESFET 151 receives the output signal of a push-pull circuit 170 (which will be described later) of the frequency dividing circuit 138. The MESFET 152 receives the output of a push-pull circuit 166 (which will be described later) of the frequency dividing circuit 137.

In the fifth embodiment of the present invention, a DCFL circuit 140 (which corresponds to the DCFL circuit 109 used in the first embodiment thereof) receives an input signal of a DCFL circuit 139 (which corresponds to the DCFL circuit 108 used in the first embodiment).

There are provided push-pull circuits 159–170, enhancement-type MESFETs 171–182 functioning as pull-up elements, enhancement-type MESFETs 183–194 functioning as pull-down elements, and enhancement-type MESFETs 195 and 196 for reset. Further, the circuit shown in FIG. 26 includes enhancement-type MESFETs 197–202 controlled by the input-signal IN, and enhancement-type MESFETs 203–208 controlled by the input signal $\overline{IN}$.

In the fifth embodiment of the present invention, the frequency-divided signal OUT is obtained at the output terminal of the push-pull circuit 165, and the frequency-divided signal $\overline{OUT}$ is obtained at the output terminal of the push-pull circuit 166.

When the frequency dividing ratio control signal CL is high, the MESFETs 158, 195 and 196 of the frequency dividing circuit 138 are ON. Hence, the frequency dividing circuit 138 is in the reset state, and the output of the push-pull circuit 196 is fixed to the low level. In the DCFL circuit 139 of the frequency dividing circuit 136, the MESFET 151 is OFF. Hence, in the above case, the frequency dividing circuit 138 does not operate, while only the frequency dividing circuit 135 operates. The frequency-dividing circuit 135 is configured by cascading the circuits 136 and 137 each equivalent to the circuit shown in FIG. 6. Hence, the frequency dividing circuit 135 operates as a ¼ frequency dividing circuit.

When the frequency dividing ratio control signal CL is low, the MESFETs 158, 195 and 196 are OFF, and the frequency dividing circuits 135 and 138 operate. In this case, the fifth embodiment of the present invention operates as a ⅕ frequency dividing circuit.

According to the fifth embodiment of the present invention, it is possible to provide a variable frequency dividing circuit with the frequency dividing ratio equal to ¼ or ⅕ which can be driven by a single power supply source and a low power supply voltage and which consumes a smaller amount of power and output complementary frequency-divided output signals.

A description will now be given of a sixth embodiment of the present invention with reference to FIG. 27. The sixth embodiment of the present invention is a variable frequency dividing circuit in which the frequency dividing ratio can be adjusted to ¼ or ⅕ in response to the frequency ratio switching control signal CL as in the case of the fifth embodiment of the present invention.

Figure 13:
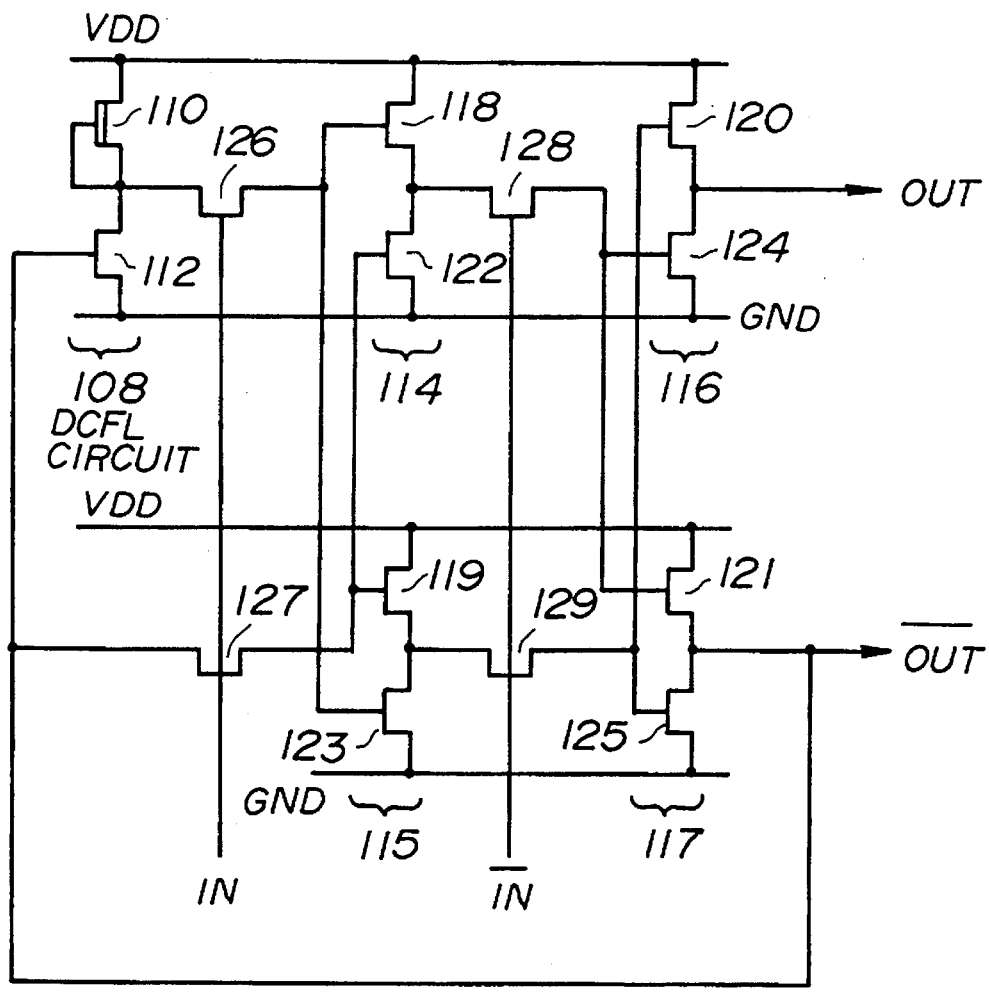
FIG. 13 is a circuit diagram of a second embodiment of the present invention.
Figure 27:
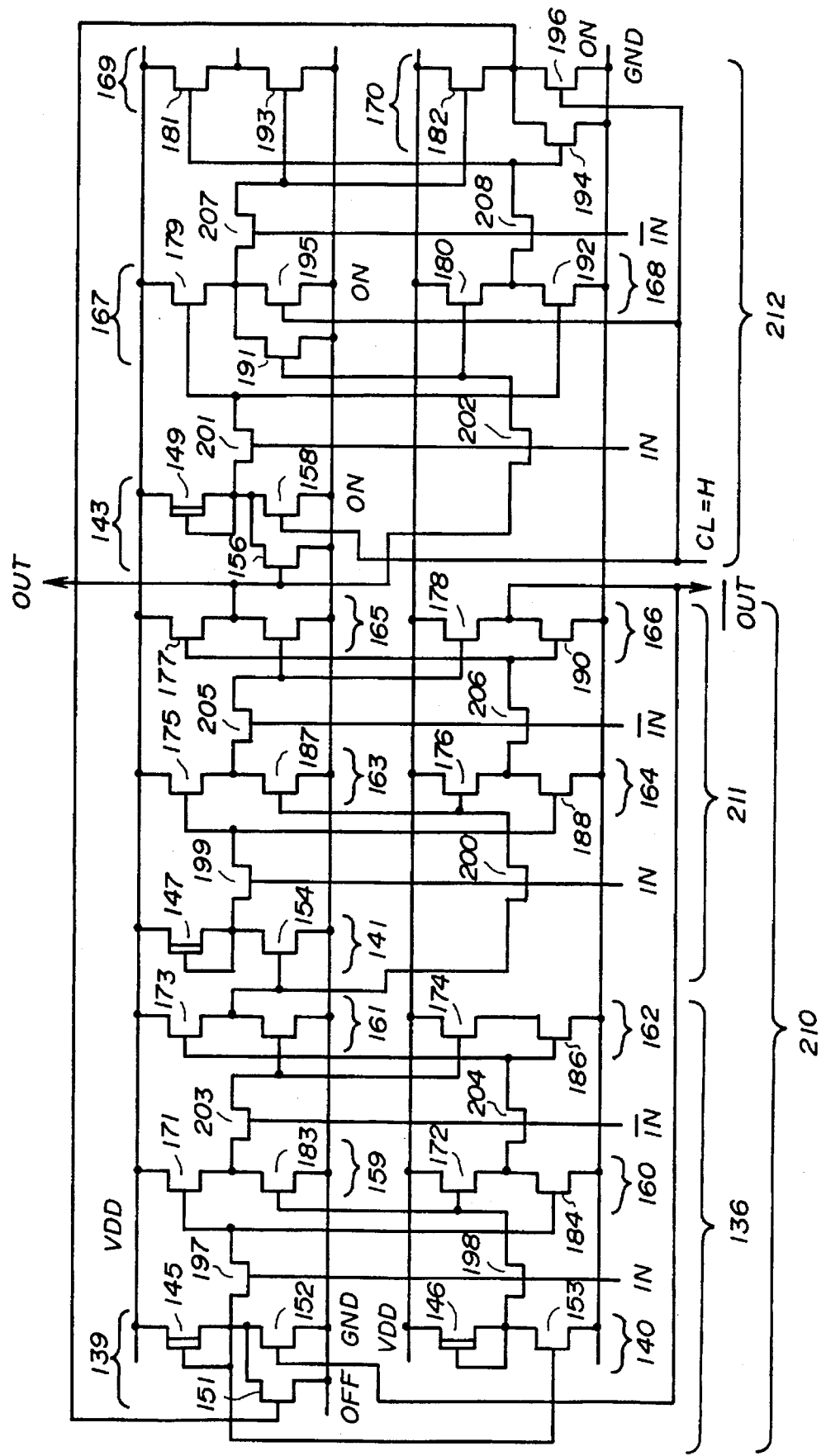
FIG. 27 is a circuit diagram of a sixth embodiment of the present invention.

In FIG. 27, there are provided a frequency dividing circuit 210 formed by cascading the frequency dividing circuit 136 equivalent to the circuit shown in FIG. 6 and a frequency dividing circuit 211 equivalent to the circuit shown in FIG. 13, and a frequency dividing circuit 212 equivalent to the circuit shown in FIG. 23.

The frequency dividing circuit 211 is configured so that the push-pull circuit 142 is deleted from the frequency dividing circuit 137 shown in FIG. 26, and the output of the push-pull circuit 161 is input to the drain of a MESFET 200. The frequency dividing circuit 212 is configured so that the push-pull circuit 144 is deleted from the frequency dividing circuit 138 shown in FIG. 26, and the output of the push-pull circuit 165 is input to the drain of a MESFET 202.

When the frequency dividing ration control signal CL is high, the MESFETs 158, 195 and 196 of the frequency dividing circuit 212 are ON, so that the circuit 212 is in the reset state. In this state, the output of the push-pull circuit 196 is fixed to the low level, and the MESFET 151 of the DCFL circuit 139 of the frequency dividing circuit 136 is OFF. Hence, in this case, the frequency dividing circuit 212 does not operate, and only the frequency dividing circuit 210 operates as a ¼ frequency dividing circuit because the circuit 210 is formed by cascading the circuit 136 equivalent to the circuit shown in FIG. 6 and the circuit 211 equivalent to the circuit shown in FIG. 13.

When the frequency dividing ration control signal CL is at the low level, the MESFETs 158, 195 and 196 are OFF, and the frequency dividing circuits 210 and 212 operate. In this case, the sixth embodiment of the present invention operates as a ⅕ frequency dividing circuit.

According to the sixth embodiment of the present invention, it is possible to provide a variable frequency dividing circuit with the frequency dividing ratio equal to ¼ or ⅕ which can be driven by a single power supply source and a low power supply voltage and which consumes a smaller amount of power and output complementary frequency-divided output signals.

Particularly, the sixth embodiment of the present invention uses only four DCFL circuits, and consumes a smaller amount of power than the fifth embodiment thereof which utilizes six DCFL circuits 139–144.

Figure 28:
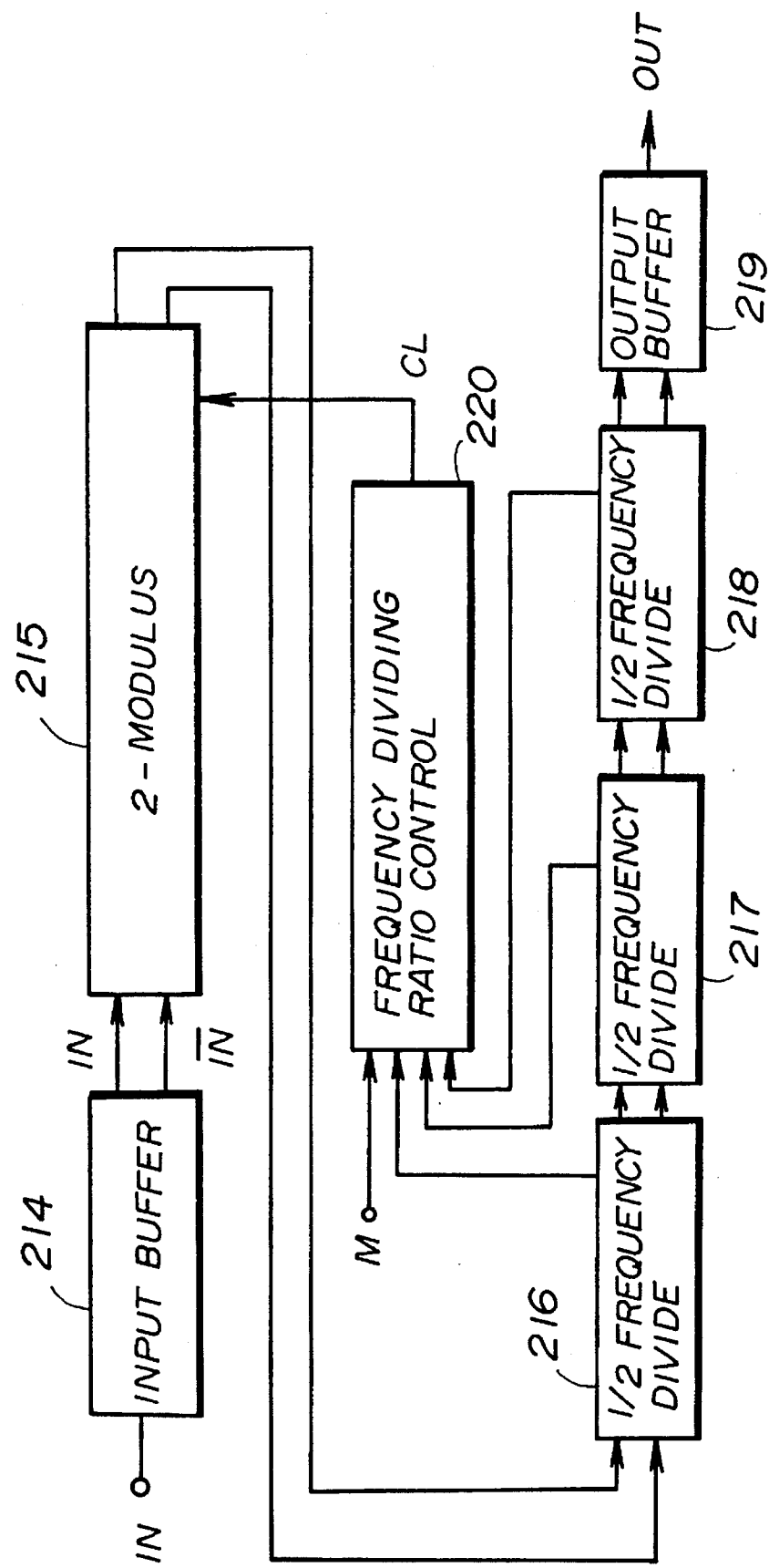
FIG. 28 is a block diagram of an application of the fifth and sixth embodiments of the present invention.

FIG. 28 is a block diagram of a 2-modulus frequency dividing circuit to which the aforementioned fifth and sixth embodiments of the present invention are applied. The circuit shown in FIG. 28 includes an input buffer unit 214, which receives the input signal IN to be frequency-divided and outputs complementary signals IN and $\overline{IN}$. The circuit also includes a 2-modulus circuit 215, ½ frequency dividing units 216–218, an output buffer unit 219, and a frequency dividing ratio control circuit 220 which outputs the aforementioned frequency dividing ration control signal CL. The 2-modulus unit 215 includes the variable frequency dividing circuit shown in FIG. 26 or shown in FIG. 27.

The frequency dividing ration control circuit 220 sets the signal CL to the high level when a 2-modulus unit control signal M which can be externally applied is high. In a case where the 2-modulus unit control signal M is low, the circuit 220 sets the signal CL to the high level when one of the output signals of the ½ frequency dividing units 216–218 is high, and sets the signal CL to the low level when all the output signals of the ½ frequency dividing units 216–218 are low.

When the 2-modulus unit control signal M is high, the frequency dividing ratio control signal CL is high, and the 2-modulus unit 215 operates as a ¼ frequency dividing circuit. Hence, the 2-modulus frequency dividing circuit operates as ¹⁄₃₂ frequency dividing circuit.

When the 2-modulus unit control signal M is low, the 2-modulus unit 215 operates as a variable frequency dividing circuit in which the frequency dividing ratio can be altered to ¼ or ⅕.

Out of eight cycles of the input signal IN, the ½ frequency dividing units 216–218 set any or all of the positive-phase outputs to the high level during the seven cycles, and sets all the positive-phase outputs to the low level during only one cycle. The 2-modulus unit 215 operates as a ¼ frequency dividing circuit during seven cycles of the input signal IN among the eight cycles thereof, and operates as a ⅕ frequency dividing circuit during only one cycle. Hence, the 2-modulus frequency dividing circuit operates as a ¹⁄₃₃ frequency dividing circuit.

The structure shown in FIG. 28 can be implemented by an integrated circuit, and can be formed on a chip. In this case, such a chip has external terminals which respectively receive the input signal IN and the external signal M and an external terminal via which the output signal OUT is output.

In the aforementioned first through sixth embodiments of the present invention, MESFETs are used. However, it is possible to employ other types of field effect transistors, such as MOSFETs (Metal Oxide Semiconductor FETs).

The present invention is not limited to the specifically disclosed embodiments, and variations and modifications may be made without departing from the scope of the present invention.

What is claimed is:

1. A frequency dividing circuit comprising:

a first inverter circuit supplied with a first frequency-divided signal;

a second inverter circuit supplied with a second frequency-divided signal which has a complementary relationship to the first frequency-divided signal;

a first pair of push-pull circuits;

a first switch circuit performing a first switching operation in response to a first input signal and selectively supplying output signals of the first and second inverter circuits to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first and second frequency-divided signals being output from the second pair of push-pull circuits.

2. The frequency dividing circuit as claimed in claim 1, wherein:

said first switch circuit comprises a first switch selectively connecting the first inverter circuit and one of the first pair of push-pull circuits together, and a second switch selectively connecting the second inverter circuit and the other one thereof together;

the second switch circuit comprises a third switch selectively connecting one of the first pair of push-pull circuits and one of the second pair of push-pull circuits together, and a fourth switch selectively connecting the other one of the first pair of push-pull circuits and the other one of the second pair of push-pull circuits together; and the first and second switches are in a closed state when the third and fourth switches are in an open state.

3. The frequency dividing circuit as claimed in claim 1, wherein the first and second inverter circuits, and the first and second pairs of push-pull circuits are supplied with first and second power supply voltages.

4. The frequency dividing circuit as claimed in claim 1, wherein the first and second inverter circuits, the first and second pairs of push-pull circuits and the first and second switch circuits respectively comprise field effect transistors.

5. A frequency dividing circuit comprising:

an inverter circuit supplied with a first frequency-divided signal;

a first pair of push-pull circuits;

a first switch circuit performing a first switching operation in response to a first input signal and selectively supplying an output signal of the inverter circuit and the first frequency-divided signal to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first frequency-divided signal being output from one of the second pair of push-pull circuits and a second frequency divided signal which is a complementary relationship to the first frequency-divided signal being output from the other one of the second pair of push-pull circuits.

6. The frequency dividing circuit as claimed in claim 5, wherein:

said first switch circuit comprises a first switch selectively connecting the inverter circuit and one of the first pair of push-pull circuits together, and a second switch selectively connecting the first frequency-divided signal to the other one thereof together;

the second switch circuit comprises a third switch selectively connecting one of the first pair of push-pull circuits and one of the second pair of push-pull circuits together, and a fourth switch selectively connecting the other one of the first pair of push-pull circuits and the other one of the second pair of push-pull circuits together; and the first and second switches are in a closed state when the third and fourth switches are in an open state.

7. The frequency dividing circuit as claimed in claim 5, wherein the inverter circuit, and the first and second pairs of push-pull circuits are supplied with first and second power supply voltages.

8. The frequency dividing circuit as claimed in claim 5, wherein the inverter circuit, the first and second pairs of push-pull circuits and the first and second switch circuits respectively comprise field effect transistors.

9. A frequency dividing circuit comprising:

a plurality of frequency-dividing parts which are cascaded, each of the plurality of frequency-dividing parts comprising:

a first inverter circuit supplied with a first frequency-divided signal;

a second inverter circuit supplied with a second frequency-divided signal which has a complementary relationship to the first frequency-divided signal;

a first pair of push-pull circuits; a first switch circuit performing a first switching operation in response to a first input signal and selectively supplying output signals of the first and second inverter circuits to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first and second frequency-divided signals being output from the second pair of push-pull circuits.

10. A frequency dividing circuit comprising:

a plurality of frequency-dividing parts which are cascaded, each of the plurality of frequency-dividing parts comprising:

an inverter circuit supplied with a first frequency-divided signal;

a first pair of push-pull circuits;

a first switch circuit performing a first switching operation in response to a first input signal and selectively supplying an output signal of the inverter circuit and the first frequency-divided signal to the first pair of push-pull circuits so that one of the first pair of push-pull circuits performs a pull-up operation when the other one thereof performs a pull-down operation;

a second pair of push-pull circuits; and a second switch circuit performing a second switching operation in response to a second input signal which has a complementary relationship to the first input signal and selectively supplying output signals of the first pair of push-pull circuits to the second pair of push-pull circuits so that one of the second pair of push-pull circuits performs a pull-up operation when the other one thereof performs a pull-down operation, the first frequency-divided signal being output from one of the second pair of push-pull circuits and a second frequency divided signal which is a complementary relationship to the first frequency-divided signal being output from the other one of the second pair of push-pull circuits.

* * * * *